(12) United States Patent
Yuki et al.

(10) Patent No.: US 7,049,198 B2
(45) Date of Patent: May 23, 2006

(54) SEMICONDUCTOR DEVICE AND METHOD FOR FABRICATING THE SAME

(75) Inventors: Koichiro Yuki, Osaka (JP); Tohru Saitoh, Osaka (JP); Minoru Kubo, Mie (JP); Kiyoshi Ohnaka, Osaka (JP); Akira Asai, Osaka (JP); Koji Katayama, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/377,771

(22) Filed: Mar. 4, 2003

(65) Prior Publication Data

US 2003/0162335 A1    Aug. 28, 2003

Related U.S. Application Data

(62) Division of application No. 09/482,076, filed on Jan. 13, 2000, now Pat. No. 6,597,016.

(30) Foreign Application Priority Data

Jan. 14, 1999    (JP)    ............................. 11-007641

(51) Int. Cl.
*H01L 21/00* (2006.01)

(52) U.S. Cl. .................. 438/300; 438/478; 438/151

(58) Field of Classification Search ............ 438/235, 438/184–188, 197–236, 72, 285–289, 291–326, 438/680–685, 718, 151, 300–308, 312, 478–479; 257/190–198, 15–22, 50–77
See application file for complete search history.

(56) References Cited

U.S. PATENT DOCUMENTS 5,323,031 A * 6/1994 Shoji et al. .................. 257/198
5,324,690 A   6/1994 Gelatos et al.

(Continued)

FOREIGN PATENT DOCUMENTS

EP    0 683 522    11/1995

(Continued)

OTHER PUBLICATIONS

F.K. LeGoues et al., "The Mechanisms of Relaxation in Strained Layer GeSi/Si Superlattices: Diffusion vs. Dislocation Formation", Mat. Res. Soc. Symp. Proc., vol. 103, pp. 185-190, 1998.

(Continued)

*Primary Examiner*—Laura M. Schillinger
(74) *Attorney, Agent, or Firm*—Donald R. Studebaker; NixonPeabody,LLP

(57) ABSTRACT

An $S_{1-y}Ge_y$ layer (where $0<y<1$), an Si layer containing C, a gate insulating film and a gate electrode are formed in this order on a semiconductor substrate. An Si/SiGe heterojunction is formed between the Si and $Si_{1-y}Ge_y$ layers. Since C is contained in the Si layer, movement, diffusion and segregation of Ge atoms in the $S_{1-y}Ge_y$ layer can be suppressed. As a result, the $Si/Si_{1-y}Ge_y$ interface can have its structural disorder eased and can be kept definite and planar. Thus, the mobility of carriers moving along the interface in the channel can be increased. That is to say, the thermal budget of the semiconductor device during annealing can be improved. Also, by grading the concentration profile of C, the diffusion of C into the gate insulating film can be suppressed and decline in reliability can be prevented.

3 Claims, 14 Drawing Sheets

U.S. PATENT DOCUMENTS

| | | | |
|---|---|---|---|
| 5,442,205 A | | 8/1995 | Brasen et al. |
| 5,561,302 A | * | 10/1996 | Candelaria .................. 257/24 |
| 5,565,690 A | * | 10/1996 | Theodore et al. ............. 257/18 |
| 5,571,741 A | | 11/1996 | Leedy |
| 5,708,281 A | * | 1/1998 | Morishita .................. 257/198 |
| 5,792,679 A | | 8/1998 | Nakato |
| 5,869,851 A | | 2/1999 | Sugawa |
| 5,891,769 A | | 4/1999 | Liaw et al. |
| 5,920,088 A | | 7/1999 | Augusto |
| 5,977,560 A | | 11/1999 | Banerjee et al. |
| 6,049,098 A | * | 4/2000 | Sato ........................ 257/198 |
| 6,059,895 A | * | 5/2000 | Chu et al. ................. 148/33.1 |
| 6,087,679 A | | 7/2000 | Yamazaki et al. |
| 6,111,267 A | | 8/2000 | Fischer et al. |
| 6,143,593 A | * | 11/2000 | Augusto ..................... 438/199 |
| 6,190,975 B1 | * | 2/2001 | Kubo et al. ................. 438/285 |
| 6,350,993 B1 | * | 2/2002 | Chu et al. ..................... 257/19 |
| 6,399,970 B1 | * | 6/2002 | Kubo et al. ................. 257/194 |
| 6,399,993 B1 | * | 6/2002 | Ohnishi et al. ............. 257/370 |
| 6,403,975 B1 | * | 6/2002 | Brunner et al. ................ 257/15 |
| 6,403,976 B1 | * | 6/2002 | Saitoh et al. .................. 257/19 |
| 6,455,364 B1 | * | 9/2002 | Asai et al. .................. 438/235 |
| 6,455,871 B1 | | 9/2002 | Shim et al. |
| 6,472,685 B1 | * | 10/2002 | Takagi ......................... 257/77 |
| 6,492,711 B1 | * | 12/2002 | Takagi et al. ............... 257/593 |
| 6,537,369 B1 | * | 3/2003 | Saitoh et al. ................... 117/3 |
| 6,563,146 B1 | * | 5/2003 | Yuki et al. .................. 257/197 |
| 6,593,625 B1 | * | 7/2003 | Christiansen et al. ....... 257/347 |
| 6,597,016 B1 | * | 7/2003 | Yuki et al. .................... 257/77 |
| 6,660,393 B1 | * | 12/2003 | Saitoh et al. ............... 428/446 |
| 6,667,489 B1 | * | 12/2003 | Suzumura et al. ............ 257/12 |
| 6,674,100 B1 | * | 1/2004 | Kubo et al. ................. 257/194 |
| 6,674,150 B1 | * | 1/2004 | Takagi et al. ............... 257/593 |

FOREIGN PATENT DOCUMENTS

| | | |
|---|---|---|
| JP | 03003366 | 1/1991 |
| JP | 04-247664 | 9/1992 |
| JP | 07-321222 | 12/1995 |
| JP | 10-093076 | 4/1998 |
| JP | 10-214906 | 8/1998 |
| JP | 2000294699 | 10/2000 |

OTHER PUBLICATIONS

M.A. Armstrong et al., "Design of Si/SiGe Heterojunction Complementary Metal-Oside-Semiconductor Transistors", IEEE IEDM 95, pp. 761-764, 1995.

G.L. Patton et al., "Oxidation of Strained SI-GE Layers Grown by MBE", Mat. Res. Soc. Symp. Proc., vol. 102, pp. 295-299, 1988.

European Patent Office, Search Report, Aug. 7, 2000, 4 pages.

Osten et al., "Carbon-containing group IV heterostructures of Si: Properties and Device Applications", 1998, pp. 11-14, Thin Solid Films, XP 000667859.

Lanzerotti et al., "Suppression of Boron Outdiffusion in SiGe HBTs by Carbon Incorporation", 1996, pp. 249-252, IEEE 10.2.1 IEDM 96.

Croke et al., "Stabilizing the Surface of Morphology of Sil-x-yGexCy/Si Heterostructures Grown by Molecular Beam Epitaxy Through the Use of a Silicon-carbide Source", Jul./Aug. 1998, pp. 1937-1942, J. Vac. Sci. Technol. B 16(4).

Nesting et al., "The Application of Novel Chemical Precursors for the Preparation of Si-Ge-C Heterostructures and Superlattices", 1998, pp. 281-286, Mat. Res. Soc. Symp. Proc. vol. 533, Materials Research Society.

Perez-Rodriguez et al., "Ion Beam Synthesis and Recrystallization of Amorphous GiGe-SiC Structures", 1996, pp. 151-155, Nuclear Instruments and Methods in Physics Research B 120, NIM B Beam Interactions with Materials & Atoms.

Notice of Reasons of Rejection Dated Dec. 16, 2003.

* cited by examiner

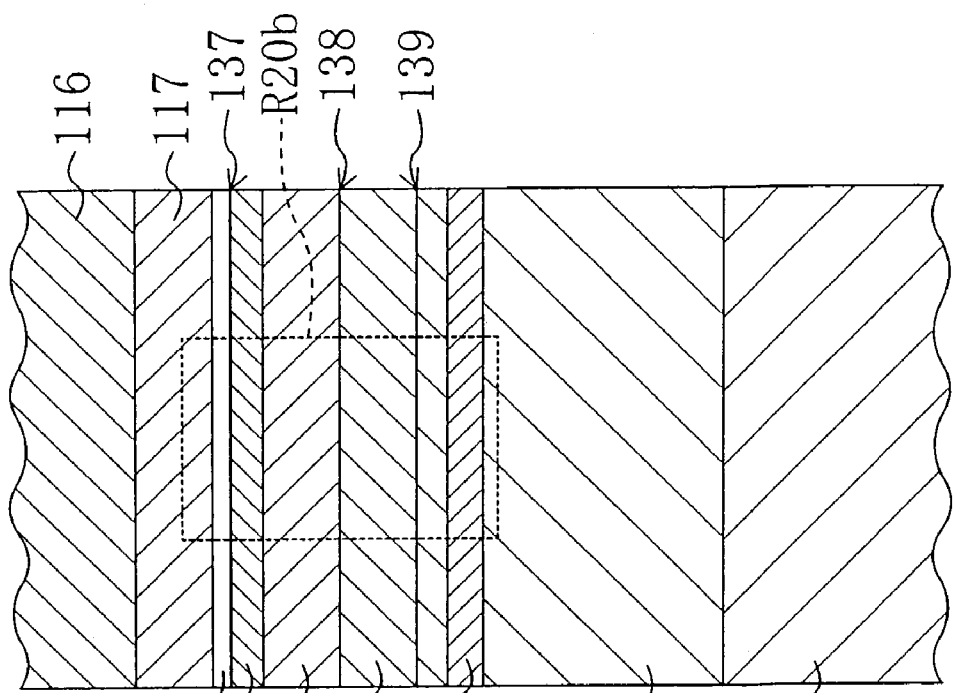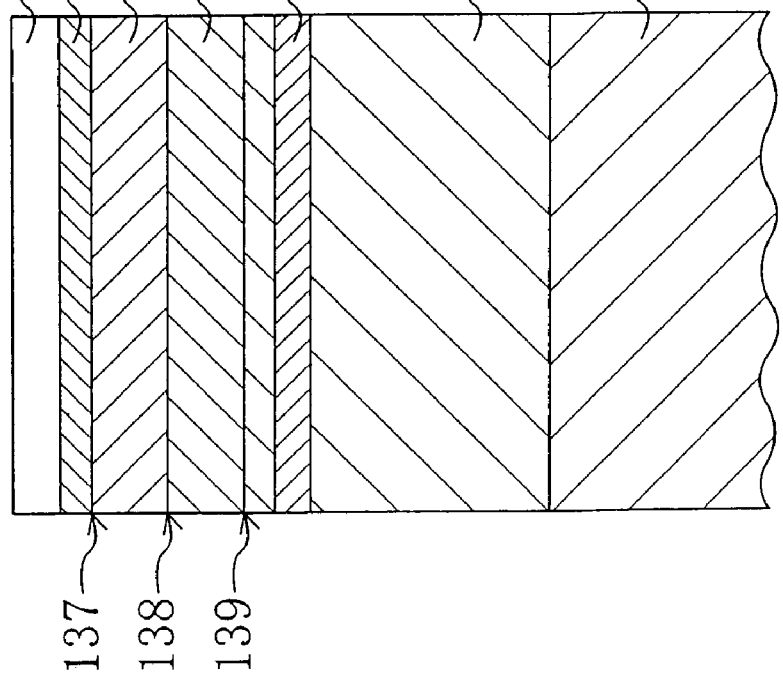

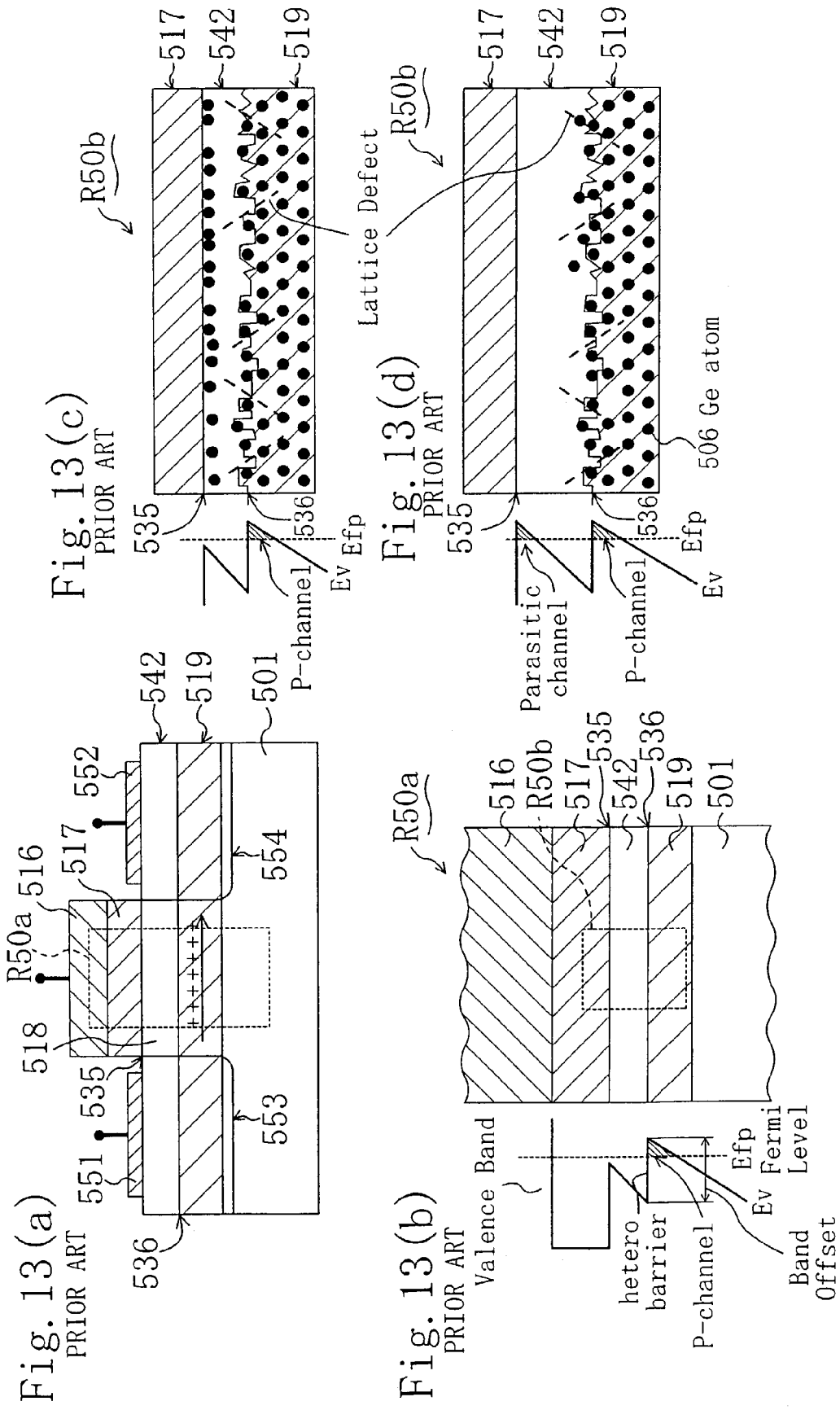

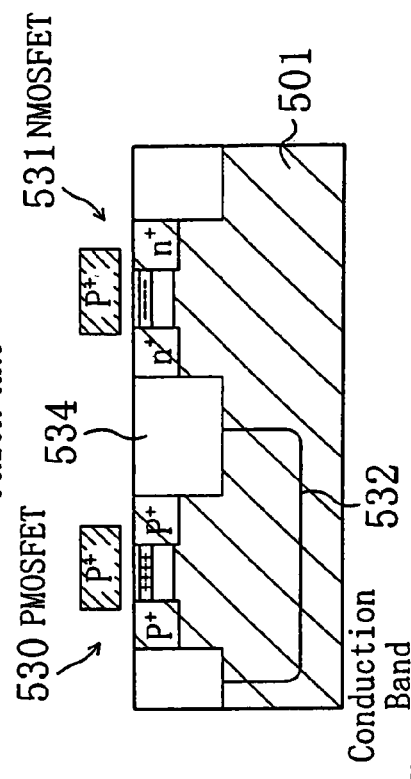
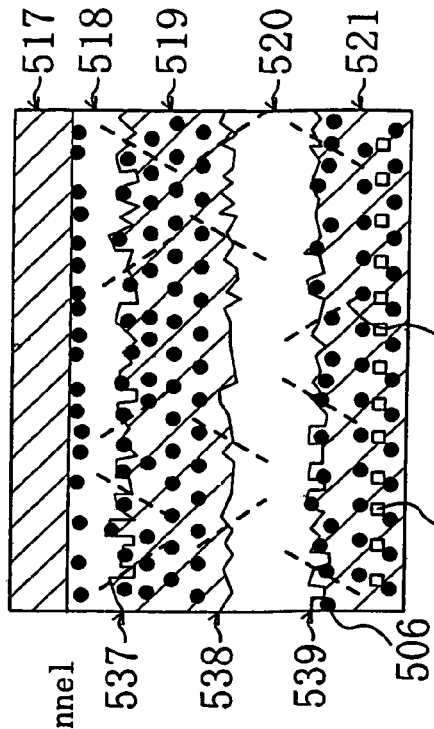
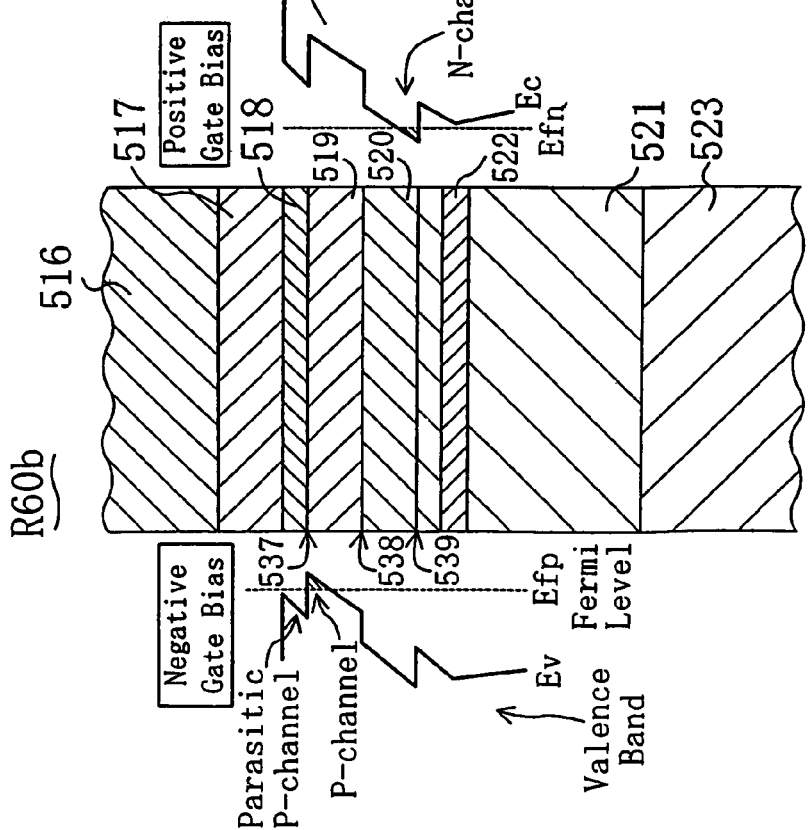

SEMICONDUCTOR DEVICE AND METHOD FOR FABRICATING THE SAME

BACKGROUND OF THE INVENTION

The present invention relates to a semiconductor device functioning as a field effect transistor including a heterojunction and a method for fabricating the same.

Radio frequency (RF) semiconductor devices have heretofore been fabricated using a substrate made of a compound semiconductor like GaAs. Recently, however, technology of fabricating RF semiconductor devices using a novel mixed crystal semiconductor, which is much more compatible with a silicon process, has been researched and developed. Among other compounds, silicon germanium, which is expressed by a chemical formula $Si_{1-x}Ge_x$ (where x is a mole fraction of Ge), is highly compatible with a silicon process in view of the fabrication technology applicable thereto. Thus, if $Si_{1-x}Ge_x$ is used, then it is possible to take full advantage of richly cultivated silicon processing technology. In addition, SiGe and silicon (Si) together form a heterojunction therebetween. Thus, by utilizing the variability of its composition $Si_{1-x}Ge_x$ (where 0<x<1) and the strain caused around the heterojunction, any device can be designed freely. Furthermore, carriers can move at a higher mobility in an SiGe layer than in an Si layer. Accordingly, a semiconductor device including an SiGe layer can operate faster with reduced noise. Paying special attention to the advantages of SiGe such as these, bipolar transistors and field effect transistors with an Si/SiGe heterojunction have been proposed, modeled and used practically.

For example, Solomon et al. of IBM Corp. proposed a heterojunction MOS transistor (HMOS transistor) including an SiGe layer as disclosed in Japanese Laid-Open Publication No. 3-3366. In this specification, the HMOS transistor of Solomon et al. will be labeled as first prior art example for convenience sake.

FIG. 13(a) is a cross-sectional view illustrating a structure of such an HMOS transistor according to the first prior art example. FIG. 13(b) is a cross-sectional view illustrating the region R50a shown in FIG. 13(a). FIG. 13(c) is a cross-sectional view illustrating movement, diffusion and segregation of Ge atoms after the HMOS transistor of the first prior art example, including a thin Si cap layer, has been annealed. And FIG. 13(d) is a cross-sectional view illustrating movement, diffusion and segregation of Ge atoms after the HMOS transistor of the first prior art example, including a thick Si cap layer, has been annealed. Only the region R50b shown in FIG. 13(b) is illustrated in FIGS. 13(c) and 13(d).

As shown in FIG. 13(a), the HMOS transistor includes: Si substrate 501; $p^+$-type polysilicon gate electrode 516; $SiO_2$ layer 517; intrinsic (i-) $Si_{1-y}Ge_y$ layer 519 (where y is a mole fraction of Ge); i-Si cap layer 542; source contact 551 connected to a source region 553; and drain contact 552 connected to a drain region 554. In FIG. 13(a), the $SiO_2$/Si and $Si/Si_{1-y}Ge_y$ interfaces are identified by the reference numerals 535 and 536, respectively.

The HMOS transistor shown in FIGS. 13(a) through 13(c) is a p-channel MOS transistor. The source/drain regions 553 and 554 and the gate electrode 516 thereof are in similar shapes to those of an ordinary Si MOS transistor. But the p-channel is formed within $Si_{1-y}Ge_y$ layer 519 to further increase the conductivity thereof. The atomic radius of Ge atoms 506 is greater than that of Si atoms. Thus, the i-$Si_{1-y}Ge_y$ layer 519 receives a compressive strain because there is a lattice misfit between the i-$Si_{1-y}Ge_y$ layer 519 and the Si substrate 501. Generally speaking, a phenomenon relaxing compressive strain is likely to occur during an epitaxy. Thus, it is not easy to stack the Si and SiGe layers consecutively while maintaining the crystallinity thereof. However, if the i-$Si_{1-y}Ge_y$ layer 519 is deposited to a critical thickness thereof or less, then no dislocations, which ordinarily relax the strain, are brought about near the $Si/Si_{1-y}Ge_y$ interface 536. As a result, these layers 519 and 542 can be stacked one upon the other in an equilibrium state with the crystallinity thereof maintained. In general, strain changes a band structure and the carrier mobility of holes. In an $Si/Si_{1-y}Ge_y$ heterojunction device, however, if the Ge mole fraction y is adjusted within such a range as not causing the dislocations, then the band offset around the interface can be optimized thanks to the compressive strain and the mobility of holes can be increased. That is to say, as shown in FIG. 13(b), the holes can be confined in a heterobarrier by utilizing the offset at the valence band in the $Si/Si_{1-y}Ge_y$ heterojunction device. Accordingly, the $Si/Si_{1-y}Ge_y$ heterojunction device is applicable as a heterojunction PMOSFET. When a negative voltage is applied to the gate electrode 516, the polarity of the regions surrounding the $Si/Si_{1-y}Ge_y$ interface 536 is inverted, thus forming a p-channel, where positive carriers (holes) are confined, along the $Si/Si_{1-y}Ge_y$ interface 536. As a result, those carriers travel at a high velocity from the source region 553 toward the drain region 554. In this case, if the $Si/Si_{1-y}Ge_y$ interface 536 is planar, then the p-channel is formed along the planar $Si/Si_{1-y}Ge_y$ interface 536, and therefore, the carriers can move at an even higher velocity.

As can be seen, a field effect transistor using SiGe can operate faster than a field effect transistor using Si.

Ismail proposed a heterojunction CMOS transistor in 1995 IEEE IEDEM Tech. Dig. 509 (see also M. A. Armstrong, D. A. Antoniadis, A. Sadek, K. Ismail and F. Stern, 1995 IEEE IEDEM Tech. Dig. 761 and Japanese Laid-Open Publication No. 7-321222). In this specification, this HCMOS transistor will be labeled as second prior art example for convenience sake.

FIG. 14(a) is a cross-sectional view illustrating a semiconductor device according to the second prior art example. FIG. 14(b) illustrates a vertical cross section of a region including gate electrode, gate insulating film and channel in the PMOS 530 or NMOS transistor 531 shown in FIG. 14(a). On the left-hand side of FIG. 14(b), shown is a valence band corresponding to a negative gate bias voltage applied. On the right-hand side of FIG. 14(b), shown is a conduction band corresponding to a positive gate bias voltage applied. FIG. 14(c) is a cross-sectional view of the region R60b shown in FIG. 14(b) illustrating movement and segregation of Ge atoms after the HCMOS transistor of the second prior art example has been annealed. As shown in FIG. 14(a), the HCMOS transistor includes Si substrate 501, PMOSFET 530, NMOSFET 531, n-well 532 and shallow trench isolation (STI) region 534. As shown in FIG. 14(b), $Si_{1-x}Ge_x$ buffer layer 523, i-$Si_{1-x}Ge_x$ spacer layer 521, δ-doped layer 522, i-Si layer 520, i-$Si_{1-y}Ge_y$ layer 519, i-Si layer 518, $SiO_2$ layer 517 and polysilicon gate electrode 516 are stacked in this order. In FIG. 14(b), first, second and third interfaces are identified by the reference numerals 537, 538 and 539, respectively.

In the example illustrated in FIG. 14(a), an HCMOS device is made up of n- and p-channel field effect transistors each including the $Si_{1-y}Ge_y$ layer 519. According to this prior art example, superior conductivity is attainable compared to a homojunction transistor formed on an Si substrate. In addition, since the n- and p-channel MOS transistors are formed using a common multilayer structure, the fabrication process thereof is simpler.

As shown in FIG. 14(b), strain can be relaxed by the $Si_{1-x}Ge_x$ buffer layer 523, on which the i-$Si_{1-x}Ge_x$ (where x=0.3) spacer layer 521 is formed. The δ-doped layer 522 for supplying carriers to the n-channel is defined within the i-$Si_{1-x}Ge_x$ spacer layer 521. The i-Si layer 520 to which a tensile strain is applied, the i-$Si_{1-y}Ge_y$ layer 519 of which the strain has been relaxed, and the i-Si cap layer 518 to which a tensile strain is applied, are stacked one upon the other on the i-$Si_{1-x}Ge_x$ spacer layer 521. On the i-Si cap layer 518, the $SiO_2$ layer 517 as the gate oxide film and the gate electrode 516 are formed in this order.

On the left-hand side of FIG. 14(b), shown is a valence band appearing when a negative gate bias voltage is applied to the multi-layered transistor shown in the center of FIG. 14(b) to make the transistor operate as PMOSFET. On the right-hand side of FIG. 14(b), shown is a conduction band appearing when a positive gate bias voltage is applied to the multi-layered transistor to make the transistor operate as NMOSFET. That is to say, one of the transistors can operate as PMOSFET and the other as NMOSFET by using the same multilayer structure.

To make the portion shown in the center of FIG. 14(b) operate as PMOSFET, holes are confined in the p-channel by utilizing the offset at the valence band in the first interface 537 between the i-$Si_{1-y}Ge_y$ layer 519 and i-Si cap layer 518. And a negative gate bias voltage is applied to the gate electrode 516, thereby making the holes move. In this case, if the magnitude of the strain is adjusted by changing the Ge mole fraction y in the i-$Si_{1-y}Ge_y$ layer 519, then the band offset in the first interface 537 is controllable. The conductivity of the holes in the i-$Si_{1-y}Ge_y$ layer 519, to which the compressive strain is applied, is higher than that of the holes in the Si layer. Thus, excellent PMOS performance is attainable.

To make the portion shown in the center of FIG. 14(b) operate as NMOSFET, electrons are confined in the n-channel by utilizing the offset at the conduction band in the third interface 539 between the i-Si layer 520 and i-$Si_{1-x}Ge_x$ spacer layer 521. And a positive gate bias voltage is applied to the gate electrode 516, thereby making the electrons move. Unlike the PMOSFET, the n-channel is formed within the Si layer 520. However, the i-Si layer 520 is receiving a tensile strain because there is a lattice misfit between the i-Si layer 520 and i-$Si_{1-x}Ge_x$ spacer layer 521. Accordingly, the band degeneracy of the electrons has been eliminated and the conductivity of the electrons is higher than that of electrons located within a normal channel in the Si layer. In this case, if the magnitude of the strain is adjusted in the same way as the PMOSFET, then the band offset is also controllable.

As can be seen, in the semiconductor device according to the second prior art example where the Si/SiGe heterojunctions are formed, the same multilayer structure shown in the center of FIG. 14(b) can be selectively used as NMOSFET or PMOSFET by changing the direction of the gate bias voltage. Accordingly, an HCMOS device with excellent conductivity can be obtained through relatively simple process steps if a single multilayer structure is separated and isolated via the STI to define separate source/drain regions and gate electrode.

However, the devices according to the first and second prior art examples have the following drawbacks.

In the field effect transistors such as the MOSFET according to the first prior art example, carriers travel along the inversion region around the Si/$Si_{1-y}Ge_y$ interface 536. Thus, the interface states greatly affect the mobility of the carriers, and the operating speed of the device. That is to say, to make the device operate at high speeds, the structure of the Si/$Si_{1-y}Ge_y$ interface 536 should not be out of order, i.e., the interface thereof should be definitely defined and planar without any fluctuations or unevenness.

However, it is difficult for the device using the Si/$Si_{1-y}Ge_y$ heterojunction to maintain the definitely defined, planar interface because of the following reasons.

For example, when the i-$Si_{1-y}Ge_y$ layer 519 and i-Si cap layer 542 are stacked consecutively as shown in FIG. 13(b), then interdiffusion is caused between Si atoms (not shown) in the i-Si cap layer 542 and Ge atoms 506 in the i-$Si_{1-y}Ge_y$ layer 519. As a result, the structure of the Si/$Si_{1-y}Ge_y$ interface 536 becomes out of order and the boundary between the i-$Si_{1-y}Ge_y$ layer 519 and i-Si cap layer 542 cannot be located definitely anymore. In FIG. 13(b), the i-$Si_{1-y}Ge_y$ layer 519 and i-Si cap layer 542 are illustrated as being clearly divided layers for the illustrative purposes only. Actually, though, the boundary between these layers 519 and 542, i.e., the interface 536, is not so definite as the illustrated one.

In a fabrication process of a semiconductor device such as a field effect transistor, just after dopants have been introduced by ion implantation, for example, to define p- and n-type doped regions, those dopants are not located at crystal lattice sites. Thus, to make these dopants act as donors or acceptors, annealing is conducted at an elevated temperature, thereby activating the dopants. In this case, annealing is carried out at a temperature as high as about 900° C. Thus, the Ge atoms 506 in the i-$Si_{1-y}Ge_y$ layer 519 move and diffuse particularly actively.

FIGS. 13(c) and 13(d) are cross-sectional views illustrating post-annealing states of the region R50b shown in FIG. 13(b) where the thicknesses of the i-Si cap layer 542 are relatively small and large, respectively. As a result of annealing, the Ge atoms 506 move and diffuse to cause segregation or lattice defects and the definiteness and planarity of the Si/$Si_{1-y}Ge_y$ interface 536 are lost as disclosed by F. K. LeGoues, S. S. Iyer, K. N. Tu and S. L. Delage in Mat. Res. Soc. Symp. Proc., Vol. 103, 185 (1988). As also described in this document, the movement, diffusion and segregation of the Ge atoms are particularly noticeable in an SiGe layer to which some strain is applied.

According to the first and second prior art examples, the $SiO_2$ layer 517 is formed as the gate oxide film by thermal oxidation. However, during the thermal oxidation, the Ge atoms are segregated at the Si/$SiO_2$ interface 535 and increase the oxidation rate as disclosed by G. L. Patton, S. S. Iyer, S. L. Delage, E. Ganin and R. C. Mcintosh in Mat. Res. Soc. Symp. Proc., Vol. 102, 295 (1988). Such a phenomenon is believed to cause various adverse effects. For example, the interface level of the Si/$SiO_2$ interface 535 rises, thus adversely affecting the mobility of carriers moving in the p-channel. The concentration distribution of Ge atoms might deviate from a desired one. And since the oxidation rate increases, it might become difficult to form a thin gate oxide film.

Thus, if the thickness of the i-Si cap layer 542 is set larger than the diffusion length of the Ge atoms as shown in FIG. 13(d), it might be possible to prevent the carrier mobility from being adversely affected by the structural disorder of the Si/$Si_{1-y}Ge_y$ interface 536. In such a case, however, a potential difference is also applied to the i-Si cap layer 542. Accordingly, the driving power of the transistor might possibly decrease. Also, since a parasitic channel is formed near the Si/SiO$_2$ interface 535 as shown in FIG. 13(d), the carriers might deviate from the intended path and the mobility thereof might decrease as a result. In addition, the structural disorder of the Si/Si$_{1-y}$Ge$_y$ interface 536 and the lattice defects such as dislocations resulting from the annealing process are still left as they are.

Some countermeasures have been taken to solve such problems. For example, the annealing temperature could be lowered to a certain degree if the i-Si$_{1-y}$Ge$_y$ layer 519 and i-Si cap layer 542 are grown epitaxially after the dopant ions have been implanted into the Si substrate 501 to define source/drain regions and then activated through annealing. In such a case, however, the ion-implanted regions and the gate electrode 516 cannot be self-aligned with each other, thus increasing the number of process steps. In addition, the dopant profile and gate alignment accuracy deteriorates due to the mask-to-mask placement error involved with a photolithographic process.

The drawbacks of the first prior art example have been specified above. It is clear that the same statement is true of the second prior art example, because structural disorder is also brought about in the first and second Si/Si$_{1-y}$Ge$_y$ interfaces 537, 538 and in the third Si/Si$_{1-x}$Ge$_x$ interface 539.

SUMMARY OF THE INVENTION

An object of the present invention is providing a semiconductor device including an Si/SiGe heterojunction, for example, with its thermal budget increased by enhancing the interfacial structure, or by getting the definiteness and planarity thereof maintained even if annealing is conducted thereon, and a method for fabricating such a device.

A semiconductor device according to the present invention includes: a semiconductor substrate; a first semiconductor layer, which is formed within the semiconductor substrate and is made of mixed crystals of multiple elements; and a second semiconductor layer, which is formed within the semiconductor substrate to be in contact with the first semiconductor layer and contains an inhibitor for suppressing movement of at least one of the constituent elements of the first semiconductor layer. The semiconductor device functions as a device using a heterojunction formed between the first and second semiconductor layers.

In the inventive semiconductor device, the movement of mixed crystal element through the interface between the first and second semiconductor layer can be suppressed. Thus, even after annealing has been carried out, the quality of the mixed crystals can be kept good, the structural disorder of the interface between the first and second semiconductor layers can be suppressed and the interface can be kept relatively definite and planar. That is to say, the mobility of the carriers moving along the interface can be kept high, thus obtaining a semiconductor device with an increased thermal budget.

In one embodiment of the present invention, where the first and second semiconductor layers are made of Si$_{1-y}$Ge$_y$ (where 0<y<1) and Si, respectively, the inhibitor is preferably C (carbon).

In this particular embodiment, the concentration of C is preferably 1% or less to keep the band structure of the Si layer appropriate.

In an embodiment where the Si layer is located closer to the surface of the semiconductor substrate than the Si$_{1-y}$Ge$_y$ layer is, a concentration of C in the Si layer preferably has such a profile as decreasing from the Si$_{1-y}$Ge$_y$ layer toward the surface of the semiconductor substrate. In such a case, it is possible to suppress C from being diffused or segregated around the surface of the semiconductor substrate. Thus, decline in reliability, which usually results from the mixture of C into the gate insulating film, is avoidable effectively.

In another embodiment, the Si$_{1-y}$Ge$_y$ layer may have a thickness equal to or smaller than its critical thickness, and receive a compressive strain. In such an embodiment, the mobility of carriers moving through the channel can be further increased. At the same time, the movement of Ge atoms, which is usually brought about with a strain applied, can still be suppressed through this action.

In still another embodiment, the semiconductor device of the present invention may be a field effect transistor further including: a gate electrode formed on the semiconductor substrate; and a channel formed in the Si layer under the gate electrode.

In this particular embodiment, the device may further include a gate insulating film interposed between the gate electrode and the Si layer.

More particularly, the device may further include an intrinsic Si layer interposed between the Si layer and the gate insulating film.

In still another embodiment, the Si layer may be located closer to the surface of the semiconductor substrate than the Si$_{1-y}$Ge$_y$ layer is. In such an embodiment, the device may further include: a second Si layer, which is formed under the Si$_{1-y}$Ge$_y$ layer and contains C; an Si$_{1-x}$Ge$_x$ layer formed under the second Si layer, where 0<x<1; and a δ-doped layer, which is formed within the Si$_{1-x}$Ge$_x$ layer in a region closer to the second Si layer and contains a high-concentration carrier dopant. In this particular embodiment, the semiconductor device of the present invention is implementable as a CMOS device including p- and n-channel field effect transistors. The p-channel field effect transistor includes a gate electrode and a p-channel. The gate electrode is formed on the semiconductor substrate, while the p-channel is defined in the Si$_{1-x}$Ge$_x$ layer under the gate electrode. The n-channel field effect transistor includes a gate electrode and an n-channel. The gate electrode is also formed on the semiconductor substrate, while the n-channel is formed in the Si layer under the gate electrode.

That is to say, the same multilayer structure can be used as active region for both the n- and p-channel field effect transistors. Thus, a CMOS device including a heterojunction can be fabricated with the number of process steps reduced.

In this particular embodiment, the Si and second Si layers preferably receive a tensile strain, while a strain applied to the Si$_{1-x}$Ge$_x$ layer has preferably been relaxed.

As an alternative, the device may further include gate insulating films formed between the gate electrodes of the p- and n-channel field effect transistors and the Si layer, respectively. In such an embodiment, a concentration of C in the Si layer preferably has such a profile as decreasing from the Si$_{1-y}$Ge$_y$ layer toward the surface of the semiconductor substrate.

In still another embodiment, a concentration of C in the second Si layer preferably has such a profile as decreasing from the Si$_{1-x}$Ge$_x$ layer toward the Si$_{1-y}$Ge$_y$ layer. In such a case, a change of band structure in accordance with the concentration variation of C can be taken advantage of. As a result, only the threshold voltage of the n-channel field effect transistor can be regulated at an appropriate value without affecting the characteristics of the p-channel field effect transistor at all.

In another alternate embodiment, a content of Ge in the Si$_{1-y}$Ge$_y$ layer may increase from the second Si layer toward the Si layer. In such an embodiment, only the threshold voltage of the p-channel field effect transistor can be regulated at an appropriate value without affecting the characteristics of the n-channel field effect transistor at all.

A first exemplary method for fabricating a semiconductor device according to the present invention includes the steps of: a) forming a first semiconductor layer, which is made of mixed crystals of multiple elements, on a substrate; b) forming a second semiconductor layer on the first semiconductor layer; and c) doping the first and second semiconductor layers with an inhibitor by implanting ions of the inhibitor thereto. The inhibitor suppresses movement of at least one of the constituent elements of the first semiconductor layer. The step c) is performed after the step b) has been performed. The semiconductor device functions as a device using a heterojunction formed between the first and second semiconductor layers.

According to this method, even if the device is subsequently annealed, the movement of mixed crystal elements is still suppressible. Accordingly, the structural disorder of the interface between the first and second semiconductor layers can be relieved, thus increasing the mobility of carriers moving through the channel of the semiconductor device.

In one embodiment where the first and second semiconductor layers are made of $Si_{1-y}Ge_y$ (where $0<y<1$) and Si, respectively, the inhibitor is preferably C.

In this particular embodiment, the method may further include the steps of: forming an intrinsic Si layer on the Si layer after the step b) has been performed and before the step c) is performed; and forming an oxide film substantially reaching the Si layer by oxidizing the intrinsic Si layer after the step c) has been performed. In this manner, the oxide film can be formed as the gate insulating film while suppressing the movement of Ge atoms in the $Si_{1-y}Ge_y$ layer.

A second exemplary method for fabricating a semiconductor device includes the steps of: a) forming a first semiconductor layer, which is made of mixed crystals of multiple elements, on a substrate; and b) forming a second semiconductor layer, which contains an inhibitor, on the first semiconductor layer such that the concentration of the inhibitor in the second semiconductor layer decreases upward. The inhibitor suppresses movement of at least one of the constituent elements of the first semiconductor layer. The semiconductor device functions as a device using a heterojunction formed between the first and second semiconductor layers.

According to this method, the structural disorder of the interface between the first and second semiconductor layers can be suppressed, while preventing the reliability of the semiconductor device from declining due to the diffusion of the inhibitor toward the surface of the substrate.

In one embodiment of the present invention, CVD, UHV-CVD or MBE process may be performed in the step b).

BRIEF DESCRIPTION OF THE DRAWINGS

FIGS. 9(a) and 9(b) are cross-sectional views illustrating part of a semiconductor device fabrication process according to the second embodiment.

FIG. 13(a) is a cross-sectional view illustrating a structure of an HMOS transistor according to a first prior art example;

FIG. 13(b) is a cross-sectional view illustrating a region of the transistor shown in FIG. 13(a);

FIG. 13(c) is a cross-sectional view illustrating movement, diffusion and segregation of Ge atoms after the transistor including a thin Si cap layer has been annealed; and FIG. 13(d) is a cross-sectional view illustrating movement, diffusion and segregation of Ge atoms after the transistor including a thick Si cap layer has been annealed.

FIG. 14(a) is a cross-sectional view illustrating a semiconductor device according to a second prior art example;

FIG. 14(b) is a cross-sectional view illustrating a region including gate electrode, gate insulating film and channel of the PMOSFET or NMOSFET shown in FIG. 14(a); and FIG. 14(c) is a cross-sectional view illustrating movement and segregation of Ge atoms after the transistor shown in FIG. 14(a) has been annealed.

DESCRIPTION OF THE PREFERRED EMBODIMENTS

Results of Fundamental Experiments

First, results of experiments carried out by the present inventors to observe how C ions implanted inhibit the movement of Ge atoms in SiGe will be described.

Figure 1A:
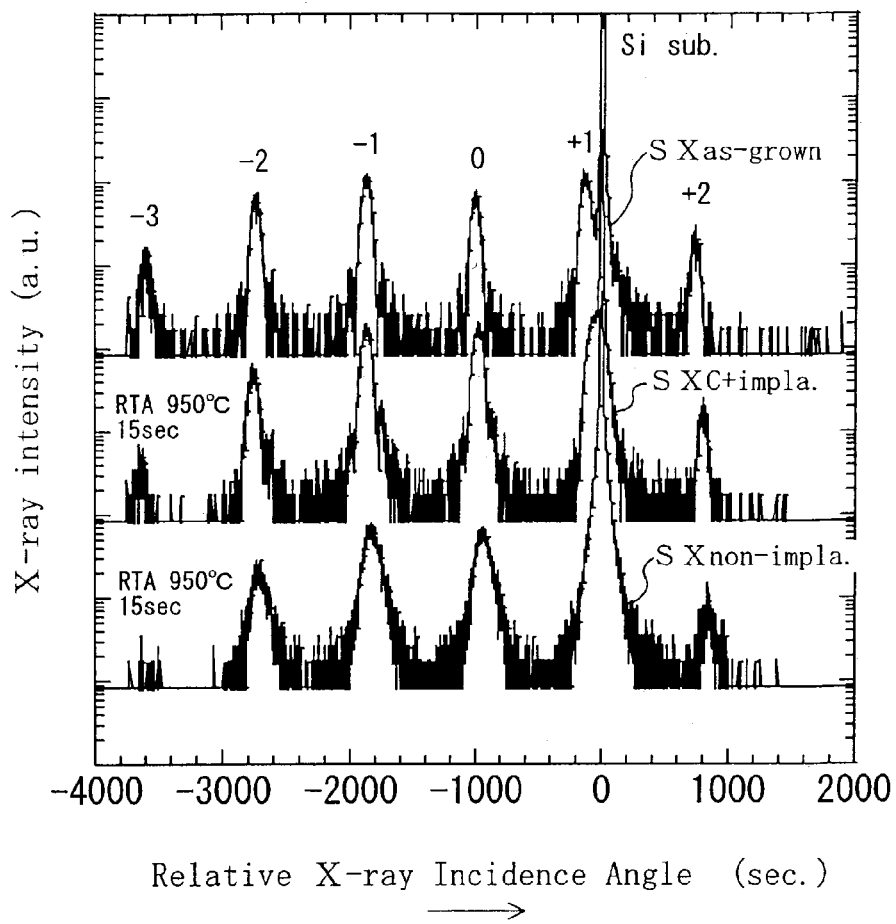
FIG. 1(a) illustrates results of an X-ray diffraction (XRD) analysis of $Si/Si_{0.8}Ge_{0.2}$ superlattice.
Figure 1B:
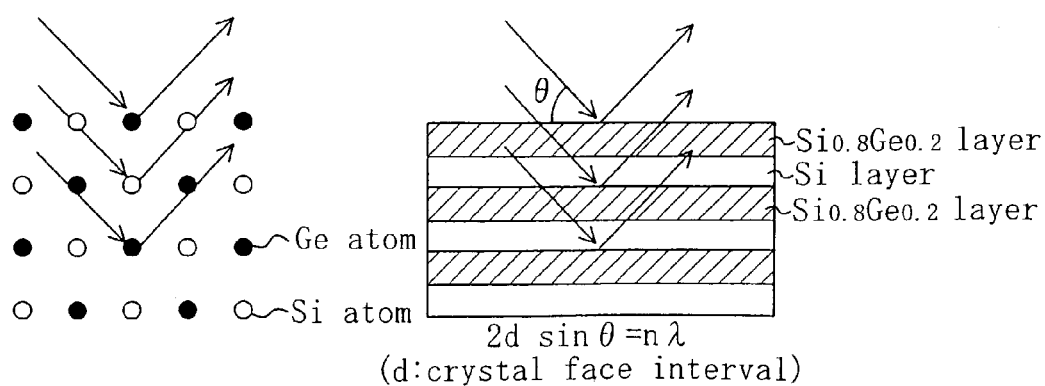
FIG. 1(b) explains peaks resulting from basic diffraction and satellite peaks as represented by the XRD spectra.

FIG. 1(a) illustrates respective thermal budgets of $Si/Si_{0.8}Ge_{0.2}$ superlattice samples including or not including C based on the results of an X-ray diffraction (XRD) analysis. FIG. 1(b) illustrates peaks resulting from basic diffraction and satellite peaks as represented by the XRD spectra. In FIG. 1(a), the XRD spectrum of an $Si/Si_{0.8}Ge_{0.2}$ superlattice sample that was epitaxially grown and then subjected to neither ion implantation nor annealing is identified by SX as-grown. The XRD spectrum of an $Si/Si_{0.8}Ge_{0.2}$ superlattice sample that was epitaxially grown, implanted with C ions and then subjected to rapid thermal annealing (RTA) is identified by SX C+impla. And the XRD spectrum of an $Si/Si_{0.8}Ge_{0.2}$ superlattice sample that was epitaxially grown and then just annealed, not implanted with C ions, is identified by SX nonimpla. In FIG. 1(a), the axis of ordinates represents the intensity of X-rays by the arbitrary unit, while the axis of abscissas represents the relative X-ray incidence angle by the second. FIG. 1(b) illustrates peaks (0) resulting from the basic diffraction where θ meeting the Bragg equation 2dsinθ=nλ satisfies the $0^{th}$-order condition, and satellite peaks ( . . . , −3, −2, −1, 1, 2, 3, . . . ) where θ satisfies higher-order conditions. According to this XRD analysis, the crystallinity of a material can be analyzed.

Figure 4:
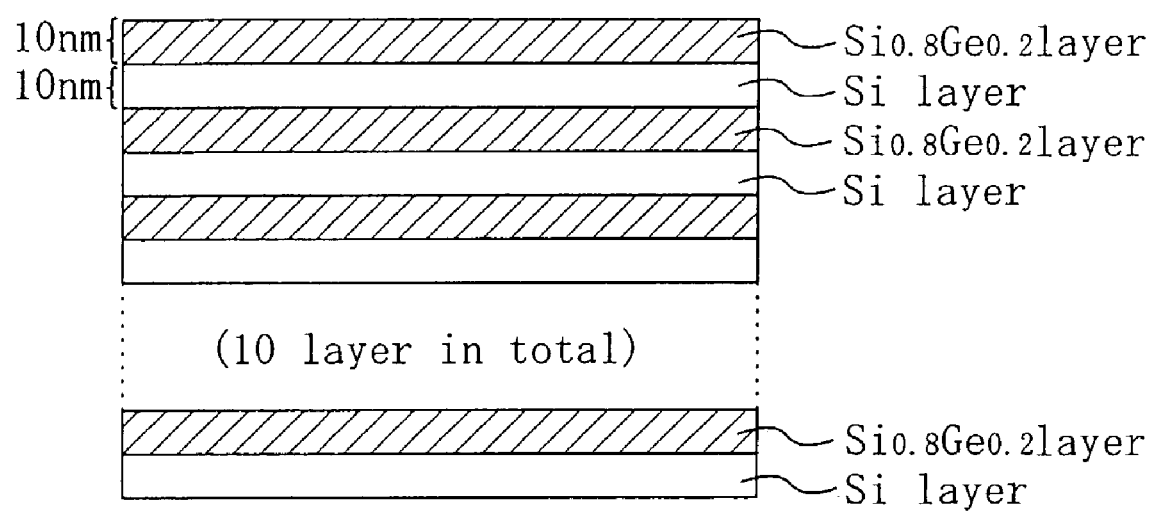
FIG. 4 is a cross-sectional view illustrating the structure of a sample prepared for the XRD analysis.

FIG. 4 is a cross-sectional view illustrating the structure of a sample prepared for the XRD analysis. As shown in FIG. 4, the sample used for the analysis was a multilayer structure in which ten $Si_{0.8}Ge_{0.2}$ layers containing Ge at 20% and ten Si layers were alternately stacked one upon the other on a silicon substrate by a UHV-CVD process. The thickness of each of these layers was 10 nm. That is to say, these layers correspond to 10 cycles. A sample, which was prepared by implanting C ions into the sample shown in FIG. 4 at a dose of about $1\times10^{15}$ cm$^{-2}$ with an accelerating voltage of about 45 keV applied thereto, and another sample not implanted with the C ions were subjected to RTA at 950° C. for 15 seconds.

As shown in FIG. 1(b), the $0^{th}$-order peaks represents beams that have been reflected from the atomic faces themselves, while the $1^{st}$, $2^{nd}$, $3^{rd}$-order peaks and so on represent the diffraction phenomenon of beams that have been reflected from the superlattice. The crystallinity of a sample can be evaluated based on the half widths of respective peaks and the frequency of appearance of higher-order peaks. In the XRD spectrum SX as-grown of the epitaxially grown but non-implanted or non-annealed sample shown in FIG. 1(a), the half width of each peak is relatively small and higher-order (i.e., up to $3^{rd}$-order) peaks are observable clearly. In contrast, in the XRD spectrum SX non-impla. of the epitaxially grown and annealed but non-implanted sample, the half width of each peak is broader and the higher-order (i.e., third-order) peaks are barely observable. And in the XRD spectrum SX C+impla. of the epitaxially grown, implanted and annealed sample, the half width of each peak is relatively small and definite and yet the higher-order (up to third-order) peaks are observable very clearly.

Figure 2:
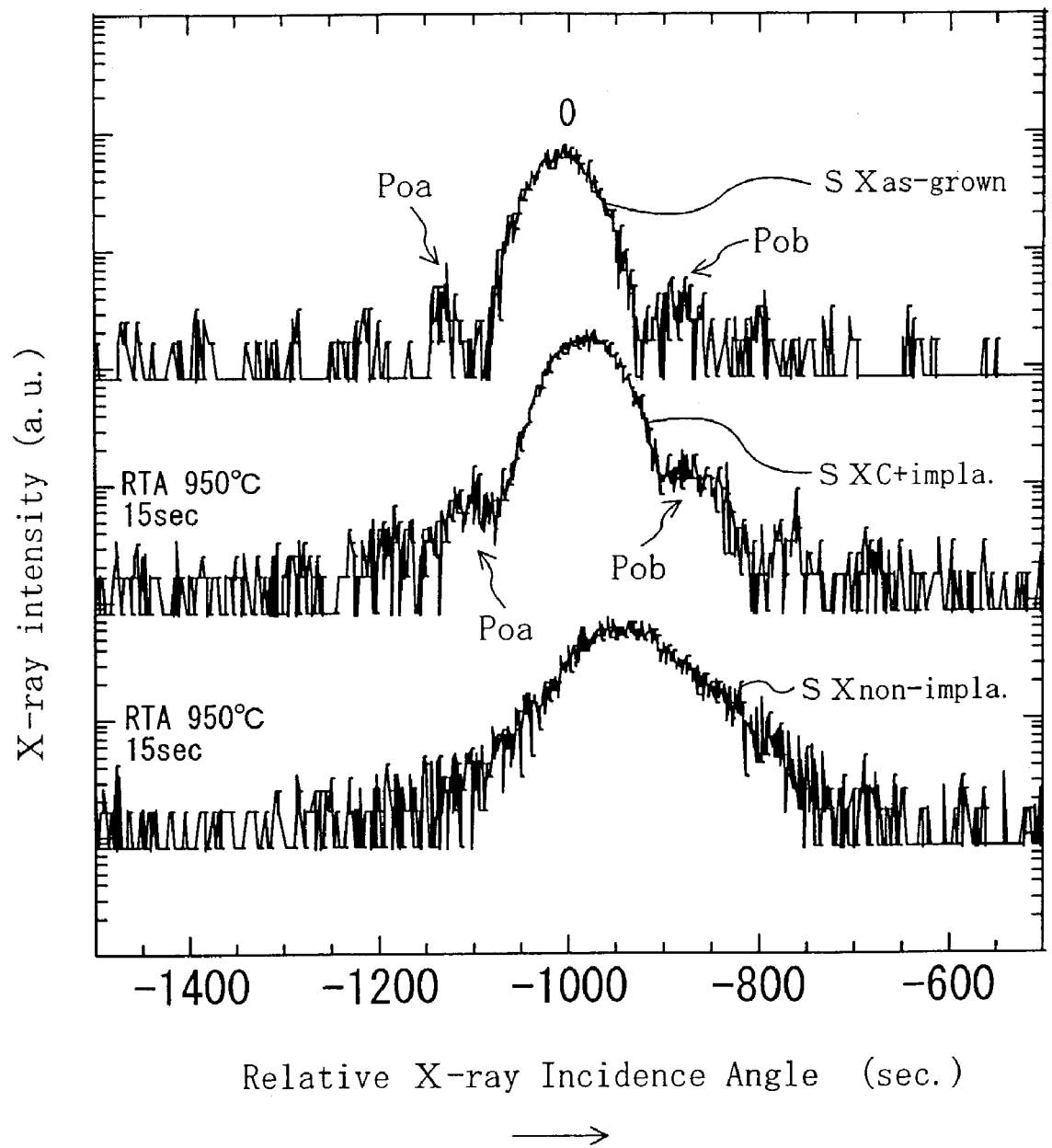
FIG. 2 illustrates, on a larger scale, portions of the XRD spectra shown in FIG. 1(a) around peaks (0) representing basic diffraction.

FIG. 2 illustrates, on a larger scale, portions of the XRD spectra shown in FIG. 1(a) around peaks (0) to analyze the shapes of the $0^{th}$-order peaks in further detail. As shown in FIG. 2, in the XRD spectrum SX non-impla. of the non-C-ion-implanted but annealed sample, peak (0) has its shape rounded and it half width broadened as a result of annealing. Also, small peaks Poa and Pob observed on right and left-hand sides of peak (0) in the spectrum SX as-grown have collapsed completely in the spectrum SX non-impla. That is to say, this result suggests that the crystallinity and interfacial definiteness of the $Si/Si_{0.8}Ge_{0.2}$ superlattice have been damaged. On the other hand, in the XRD spectrum SX C+impla. of the C-ion-implanted and annealed sample, the half width of peak (0) is kept narrow and those small peaks Poa and Pob still exist on both sides of the $0^{th}$-order peak. This result tells us that the C-ion-implanted sample kept good crystallinity even after having been annealed.

Figure 3:
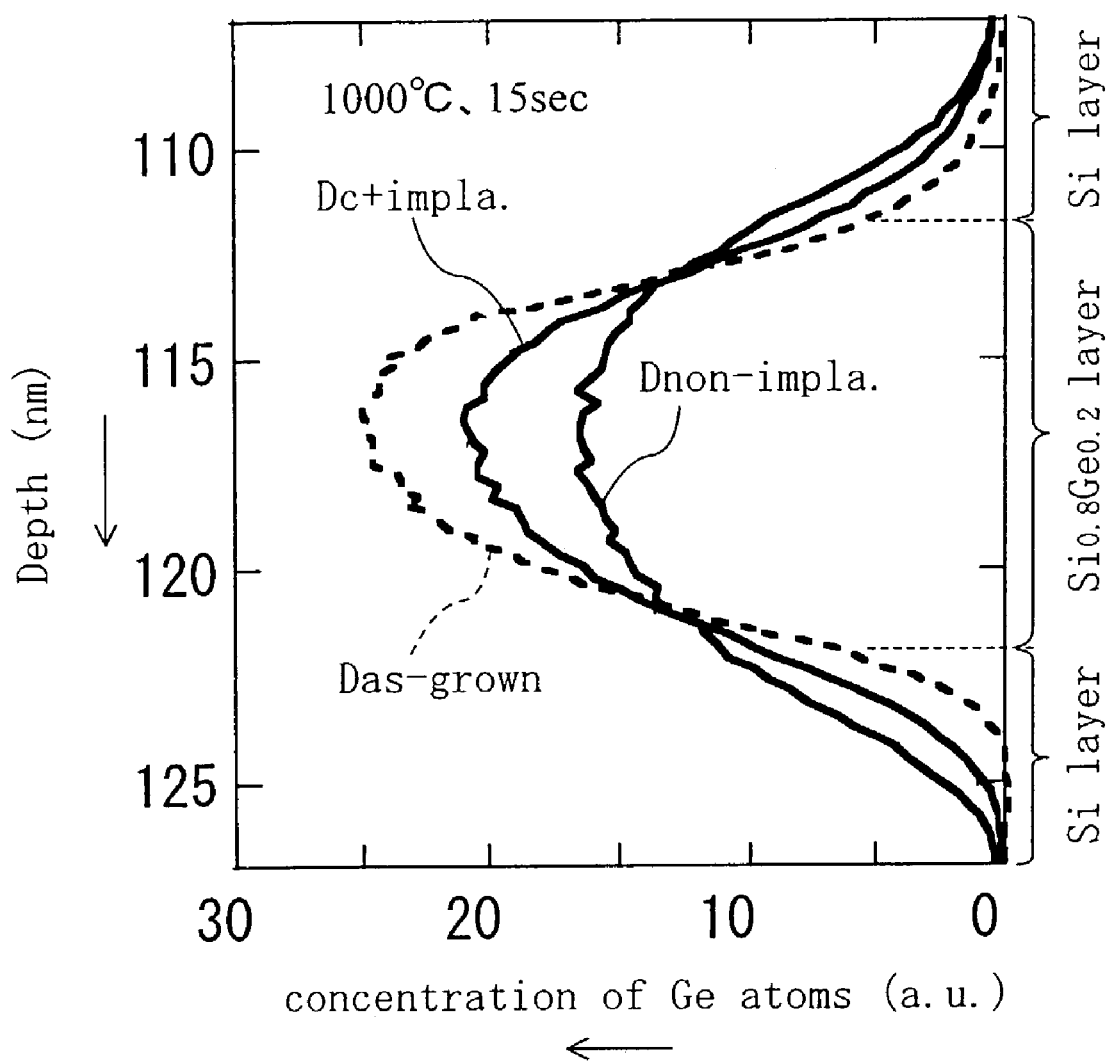
FIG. 3 illustrates concentrations of Ge in respective superlattice samples used for the experiment.

FIG. 3 illustrates concentrations of Ge in the respective superlattice samples to examine the stability of crystals that have been subjected to the RTA. In FIG. 3, the concentration profile of Ge in the epitaxially grown but non-implanted or annealed sample is identified by the curve D as-grown. The concentration profile of Ge in the sample that was epitaxially grown, implanted with C ions and then subjected to RTA at 1000° C. for 15 seconds is identified by the curve D C+impla. And the concentration profile of Ge in the sample that was epitaxially grown and then subjected to RTA at 1000° C. for 15 seconds without being implanted with C ions is identified by the curve D non-impla. As shown in FIG. 3, the Ge concentration is very high in the $Si_{0.8}Ge_{0.2}$ layer and low in the Si layer during the epitaxy. However, if the non-C-ion-implanted sample is annealed, then the concentration profile D non-impla. becomes gentler. That is to say, it can be seen that a great number of Ge atoms have moved into the Si layers. In contrast, the concentration profile D C+impla. of the C-ion-implanted sample is less gentle than the curve D non-impla. even after annealing has been carried out. This result shows that a smaller number of Ge atoms have moved into the Si layers. It should be noted that the Ge concentration profiles shown in FIG. 3 are gentler than the actual ones because there is a limit of measurement precision for every sample.

Taking all of these data shown in FIGS. 1(a), 2 and 3. into consideration, the following conclusion can be drawn. First, as for the non-C-ion-implanted sample, the thickness of the $Si_{0.8}Ge_{0.2}$ layer was found increased by about 1.7 nm upward and downward. This increase was estimated based on a model where Ge atoms were supposed to be distributed over a region with a predetermined width around the interface. That is to say, as for the prior art semiconductor device including the Si/SiGe heterojunction, the results obtained were as if the width of the SiGe layer had apparently expanded due to the structural disorder of the Si/SiGe interface. However, since the number of Ge atoms cannot have increased, there is no reason to think that the Si layer shrunk and the SiGe layer expanded. Rather, we should think that actually some structural disorder was brought about in the Si/SiGe interface by the movement and diffusion of Ge atoms. In contrast, if the sample had been implanted with C ions in advance, the crystallinity of the sample was found good. This is probably because the movement and diffusion of Ge atoms could be suppressed during the subsequent annealing process and there was not so much disorder in the SiGe interface thanks to the existence of C atoms.

Figure 5A:
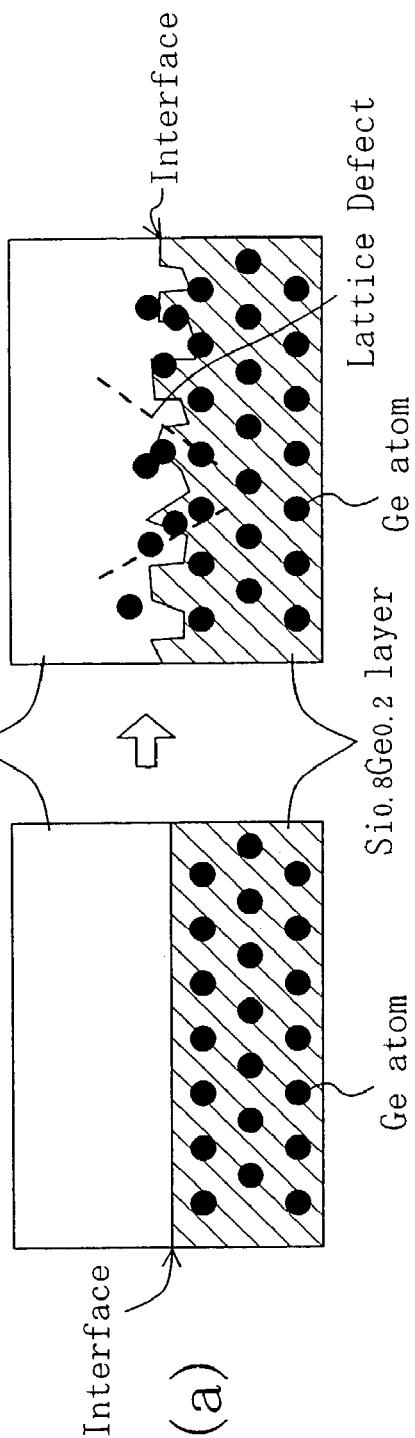
FIGS. 5(a) and 5(b) illustrate how the interfacial structure changes through annealing for a sample not doped with C and a sample doped with C, respectively.
Figure 5B:
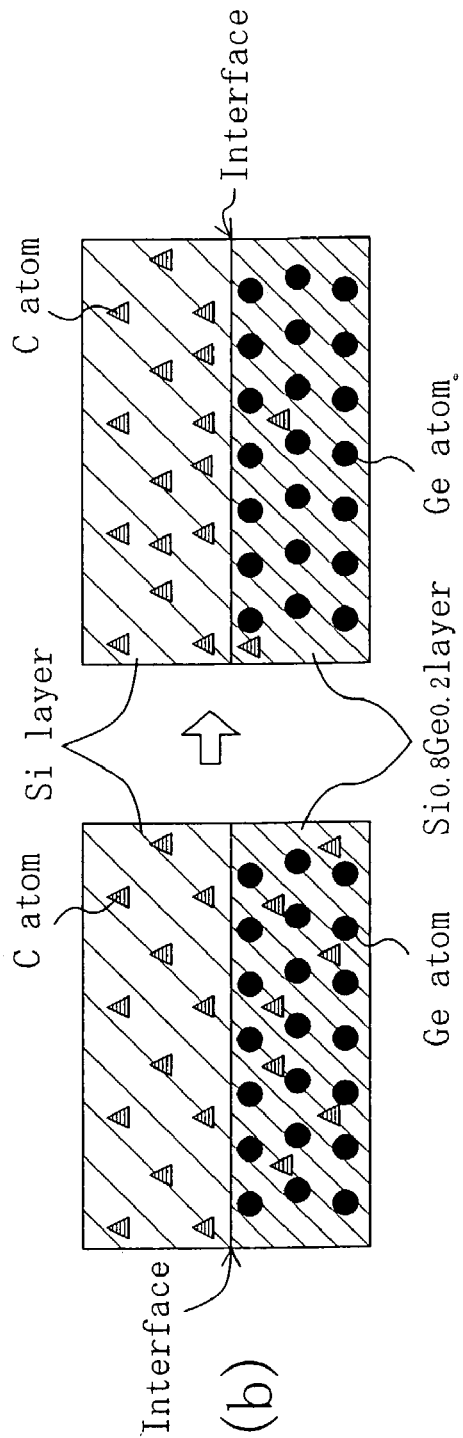

FIGS. 5(a) and 5(b) illustrate how the interfacial structure changes through annealing for a sample not implanted with C ions and a sample implanted with C ions, respectively. As shown in FIG. 5(a), if the sample is not implanted with C ions, then it is expected that a large number of Ge atoms would move, diffuse and segregate around the $Si/SiO_2$ interface located above as a result of annealing. In addition, in the sample not implanted with C ions, the composition thereof greatly changes locally around the interface and the Ge atoms and Si atoms (not shown) do not form crystal lattice but are arranged non-regularly in a disordered state. It is believed that the interface of such a sample becomes indefinite and more uneven for that reason. In contrast, in the sample that has been implanted with C ions, it is believed that the crystallinity thereof is kept good and the Si/SiGe interface is kept definite and relatively flat because the movement and diffusion of Ge atoms are suppressed as shown in FIG. 5(b). It should be noted, however, that the illustration on the lower right corner of FIG. 5(b) shows an ideal state. Thus, it is estimated that actually some structural disorder might be brought about in the interface even if the sample has been implanted with C ions. Also, we confirmed that the C atoms moved from the SiGe layer into the Si layer in the C-ion-implanted sample.

At present, it is not clear why the C ion implantation suppresses the movement and diffusion of Ge atoms. However, we can at least conclude that by taking advantage of such a phenomenon, the movement and diffusion of Ge atoms can be suppressed and the interface can be kept definite and planar even if a device including the Si/SiGe heterojunction is annealed to activate the dopant. In addition, since the movement and diffusion of Ge atoms are suppressed, the number of Ge atoms segregated at the $Si/SiO_2$ interface can also be minimized. Accordingly, if C ions are implanted after SiGe and Si layers have been stacked or if C atoms have been introduced in advance into the SiGe layer, then a semiconductor device including the Si/SiGe heterojunction can be fabricated by performing a smaller number of process steps with the gate electrode self-aligned with the source/drain regions.

Also, the movement and diffusion of Ge atoms in the SiGe layer can be suppressed even after the C atoms have moved into the Si layer. Thus, it can be seen that the structural disorder of the Si/SiGe interface due to the movement and diffusion of Ge atoms is suppressible if the C atoms have been introduced in advance into at least the Si layer.

However, it is known that if a field effect transistor including the Si/SiGe heterojunction is fabricated by taking advantage of the Ge atom movement inhibiting function of C atoms, then the reliability of the gate insulating film, or a gate oxide film, in particular, of the field effect transistor declines because of the existence of the impurity. Thus, to ensure reliability for the gate insulating film, it is not preferable that various organic compounds of C, O and H are formed in the gate insulating film. Accordingly, in introducing C into the SiGe layer, measures should be taken to prevent C from adversely affecting the gate insulating film.

Hereinafter, preferred embodiments of the present invention will be described based on the results of the foregoing experiments.

Embodiment 1

Figure 6A:
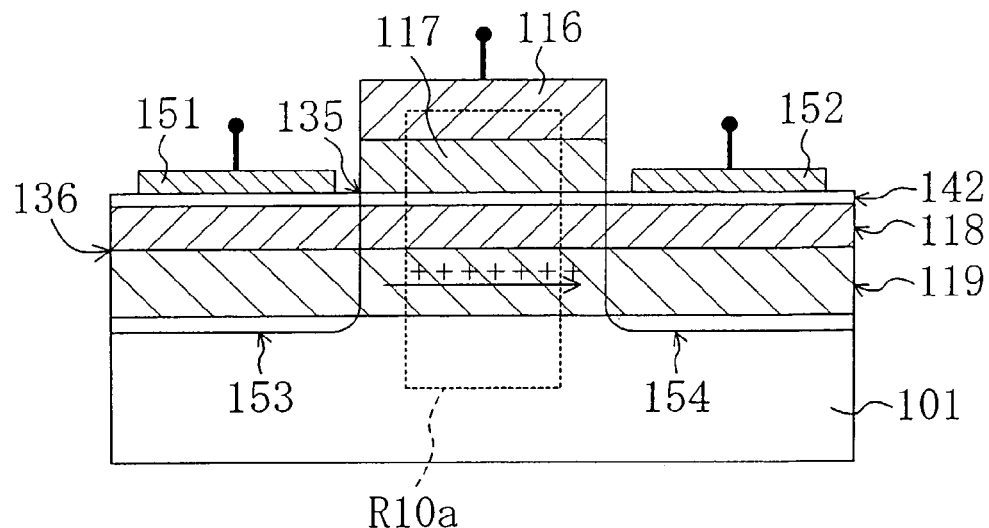
FIG. 6(a) is a cross-sectional view illustrating a structure of an HMOS transistor according to a first embodiment of the present invention.
Figure 6B:
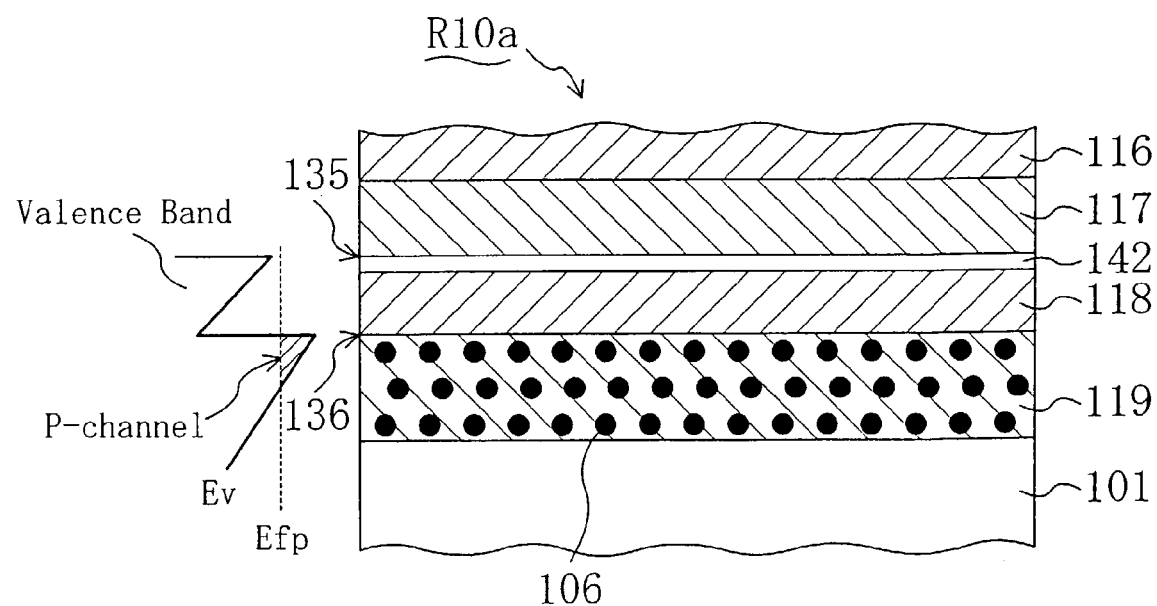
FIG. 6(b) is a cross-sectional view illustrating a structure of a region shown in FIG. 6(a).

FIG. 6(a) is a cross-sectional view illustrating a structure of an HMOS transistor according to a first embodiment of the present invention. FIG. 6(b) is a cross-sectional view illustrating a structure of a region R10a shown in FIG. 6(a).

As shown in FIG. 6(a), the HMOS transistor includes: Si substrate 101; $p^+$-type polysilicon gate electrode 116; $SiO_2$ layer 117; intrinsic (i-) Si cap layer 142; lower Si cap layer 118 containing C; i-$Si_{1-y}Ge_y$ layer 119 (where 0<y<1, e.g., y=0.2); source contact 151 connected to a source region 153; and drain contact 152 connected to a drain region 154. In FIG. 6(a), the $SiO_2$/Si interface and Si/$Si_{1-y}Ge_y$ interfaces are identified by the reference numerals 135 and 136, respectively.

The basic structure of the HMOS transistor shown in FIGS. 6(a) and 6(b) is the same as that of the HMOS transistor according to the first prior art example shown in FIGS. 13(a) and 13(b). Thus, in the following description, the features of the transistor according to this embodiment will be mainly detailed.

According to the first embodiment, the thickness of the i-$Si_{1-y}Ge_y$ layer 119 is set equal to or less than the critical thickness thereof. Thus, the layers 118 and 119 are in an equilibrium state with their crystallinity maintained and the mobility of carriers (holes) has been changed due to a compressive strain applied. As described above, to attain conductivity superior to that of a homojunction transistor formed on an Si substrate, the interface should be kept definite and planar. Thus, to suppress the movement and diffusion of Ge atoms and segregation of Ge atoms in a region just under the gate oxide film, the lower Si cap layer 118 containing C is provided over the i-$Si_{1-y}Ge_y$ layer 119. In this case, the concentration of C to be doped should not be high enough to adversely affect the characteristics of the transistor or the band structure thereof, e.g., about 1% or less. With C contained, the interface can always be kept definite and planar throughout the process steps of stacking the respective layers and the annealing process to activate the dopant.

Thus, as shown in FIG. 6(b), the holes can be confined in a heterobarrier by utilizing the offset at the valence band. Accordingly, the Si/$Si_{1-y}Ge_y$ heterojunction device is applicable as a heterojunction PMOSFET. When a negative voltage is applied to the gate electrode 116, the polarity of the regions surrounding the Si/$Si_{1-y}Ge_y$ interface 136 is inverted, thus forming a p-channel, where positive carriers (holes) are confined, in the $Si_{1-y}Ge_y$ layer 119. As a result, those carriers move at a high velocity from the source 153 toward the drain region 154. According to this embodiment, since the Si/$Si_{1-y}Ge_y$ interface 136 is planar, the p-channel is formed along the planar Si/$Si_{1-y}Ge_y$ interface 136, and therefore, the carriers can move at an even higher velocity.

Next, a method for fabricating the HMOSFET according to the first embodiment will be described with reference to FIGS. 7(a) through 7(d). As described above, if C exists in the Si/$SiO_2$ interface 135, then the reliability of the gate insulating film might be risked. Thus, according to this embodiment, the i-Si cap layer 142 not containing C is formed on the lower i-Si cap layer 118 containing C. And a gate oxide film is formed by getting the i-Si cap layer 142 eroded with oxygen (i.e., by an oxidation process).

Figure 7A:
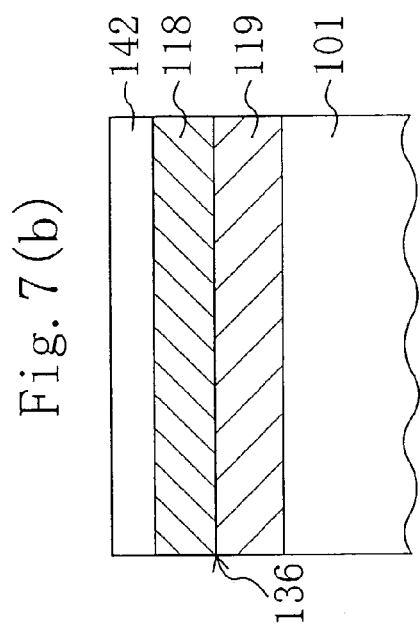
FIGS. 7(a) through 7(d) are cross-sectional views illustrating respective process steps for fabricating the semiconductor device according to the first embodiment.

First, in the process step shown in FIG. 7(a), the i-$Si_{1-y}Ge_y$ layer 119 is epitaxially grown on the Si substrate 101.

Figure 7B:
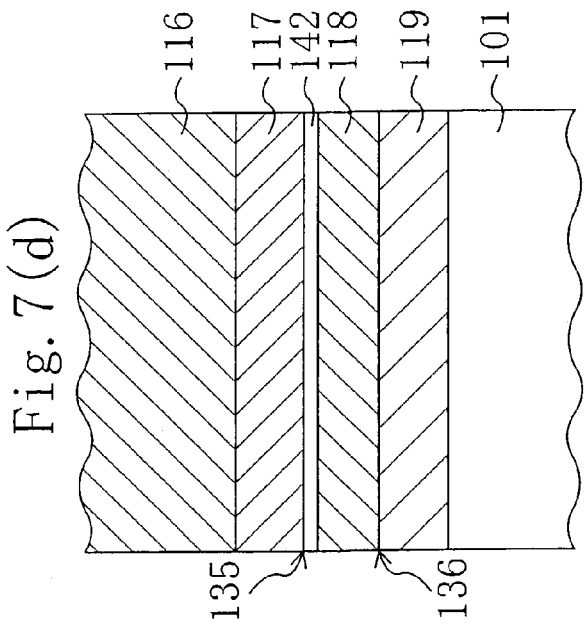

Next, in the process step shown in FIG. 7(b), the lower Si cap layer 118 containing C and i-Si cap layer 142 not containing C are stacked in this order on the i-$Si_{1-y}Ge_y$ layer 119. C may be introduced into the lower Si cap layer 118 by ion implantation, CVD, UHV-CVD or MBE. If the ion implantation method is adopted, the C ion implantation may be performed in the middle of the process step shown in FIG. 7(b), i.e., after the lower Si cap layer 118 has been formed and before the i-Si cap layer 142 is formed.

Figure 7C:
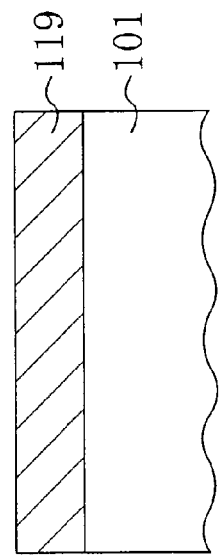

Then, in the process step shown in FIG. 7(c), the i-Si cap layer 142 is oxidized, thereby forming the $SiO_2$ film 117 to be the gate oxide film. In this process step, the oxidation may be stopped at about 750° C. just before the Si/$SiO_2$ interface 135 reaches the lower Si cap layer 118 containing C while taking the diffusion rate of C and oxidation rate of Si into account.

Figure 7D:
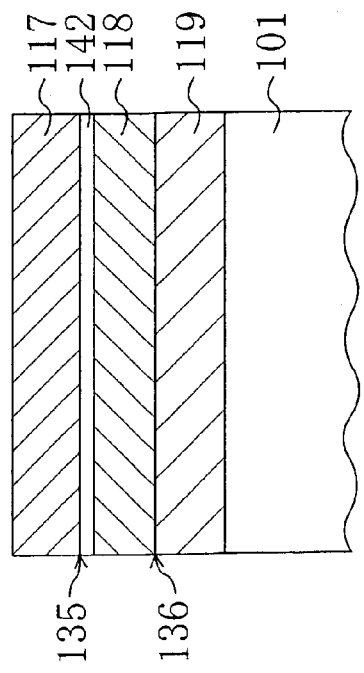

Subsequently, in the process step shown in FIG. 7(d), a $p^+$-type polysilicon film is deposited and then patterned, thereby forming the gate electrode 116. Although the illustration of subsequent process steps is omitted, carrier dopant ions (e.g., boron fluoride ($BF_2^+$) ions in this embodiment) are implanted into the substrate from above the gate electrode as in the ordinary MOS transistor fabrication process. In this manner, the source/drain regions 153, 154 are defined to be self-aligned with the gate electrode 116 (see FIG. 6(a)). Furthermore, a metal film is deposited over the substrate and then patterned, thereby forming the source/drain contacts 151, 152.

According to the method of the first embodiment, by adopting the process steps shown in FIGS. 7(a) through 7(d), the movement and diffusion of Ge atoms around the Si/$Si_{1-y}Ge_y$ interface 136 is suppressible thanks to the Ge atom movement inhibiting function of C. As a result, the interface can be kept definite and planar and various adverse effects, such as decline in reliability resulting from the segregation of Ge atoms around the SiO₂ film 117 during the formation of the gate oxide film, can be eliminated.

As described above, C may be introduced into the lower Si cap layer 118 by ion implantation with low implant energy, CVD using methyl silane (SiH₃CH₃), UHV-CVD or MBE. When the ion implantation process is adopted, a certain quantity of C is implanted into the i-Si$_{1-y}$Ge$_y$ layer 119, too. In contrast, if the CVD, UHV-CVD or MBE process is adopted, then C can be introduced into only the lower Si cap layer 118. It should be noted, however, that C may be introduced into the i-Si$_{1-y}$Ge$_y$ layer 119 even if the CVD, UHV-CVD or MBE process is adopted.

The dose of C to be introduced into the lower Si cap layer 118 may be large to suppress the movement and diffusion of Ge atoms. Actually, though, it is known that once the concentration of C exceeds 1%, the crystal structures of Si and SiGe layers are adversely affected. Thus, to make the semiconductor device with the Si/SiGe heterojunction operate normally, the concentration of C is preferably 1% or less.

Embodiment 2

Figure 8:
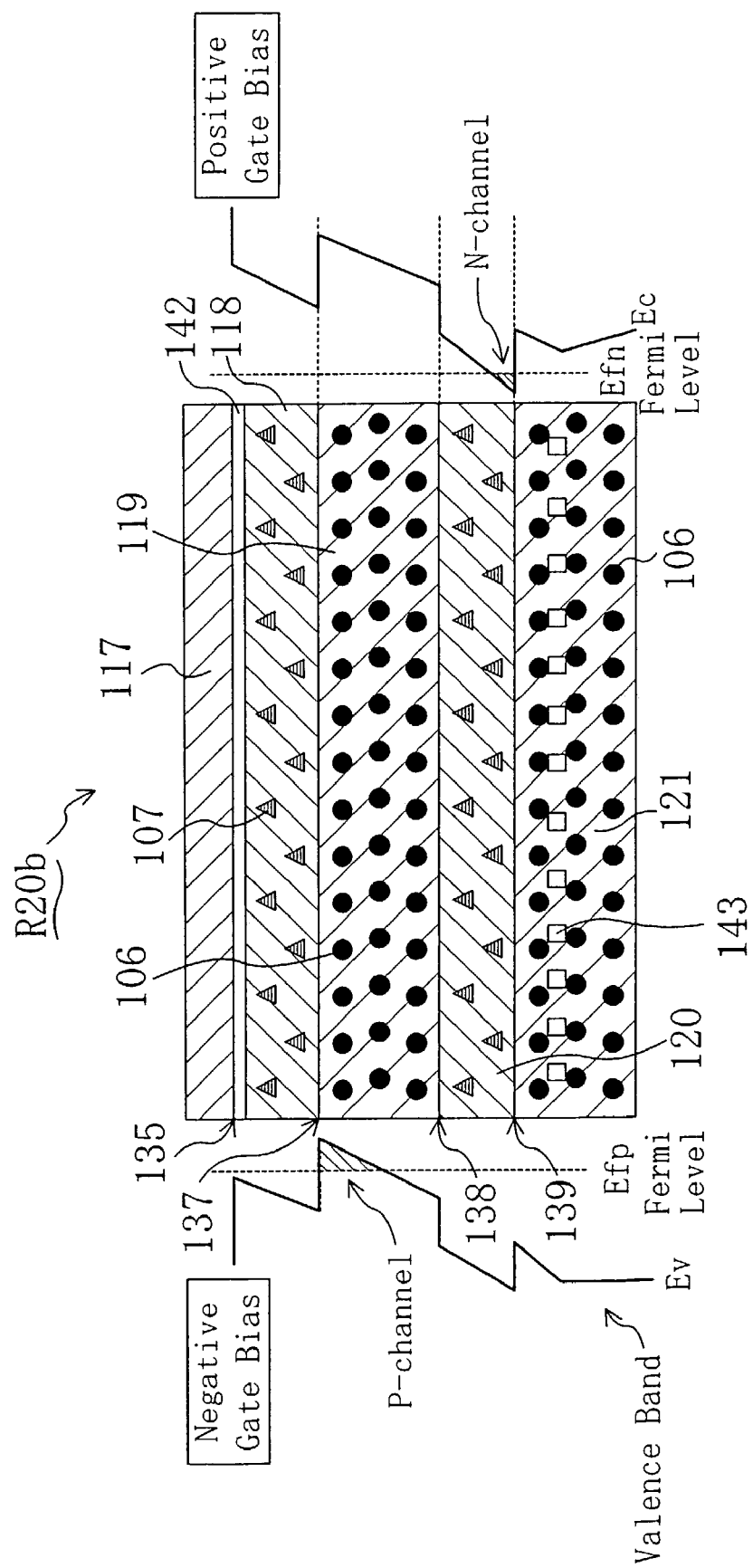
FIG. 8 is a cross-sectional view illustrating part of a semiconductor device according to a second embodiment of the present invention.

FIG. 8 is a cross-sectional view illustrating part of a semiconductor device according to a second embodiment of the present invention. FIG. 8 illustrates a vertical cross section of a region R20*b* including gate electrode, gate insulating film and channel shown in FIG. 9(*b*), which is a multilayer structure applicable to both PMOS and NMOS transistor according to the second prior art example shown in FIG. 14(*a*). On the left-hand side of FIG. 8, shown is a valence band corresponding to a negative gate bias voltage applied. On the right-hand side of FIG. 8, shown is a conduction band corresponding to a positive gate bias voltage applied.

As shown in FIGS. 8, 9(*a*) and 9(*b*), Si$_{1-x}$Ge$_x$ buffer layer 123, i-Si$_{1-x}$Ge$_x$ spacer layer 121, δ-doped layer 122, i-Si layer 120 containing C, i-Si$_{1-y}$Ge$_y$ layer 119 (where 0<y<1, e.g., y=0.2), lower Si cap layer 118 containing C, i-Si cap layer 142, SiO₂ layer 117 functioning as a gate insulating film and polysilicon gate electrode 116 are stacked in this order. Also, SiO₂/Si interface and first, second and third interfaces are identified by the reference numerals 135, 137, 138 and 139, respectively. Furthermore, in FIG. 8, Ge, C and dopant atoms are identified by the reference numerals 106, 107 and 143, respectively.

According to this embodiment, an HCMOS device is made up of n- and p-channel MOS transistors each including the Si$_{1-y}$Ge$_y$ layer 119 as in the second prior art example. Also, according to this embodiment, superior conductivity is attainable compared to a homojunction transistor formed on an Si substrate. In addition, since the n- and p-channel MOS transistors are formed using a common multilayer structure, the fabrication process thereof is simplified.

As shown in FIGS. 8, 9(*a*) and 9(*b*), strain can be relaxed by the Si$_{1-x}$Ge$_x$ (where 0<x<1, e.g., x=0.3) buffer layer 123, on which the i-Si$_{1-x}$Ge$_x$ spacer layer 121 is formed. The δ-doped layer 122 for supplying carriers to the n-channel is defined within the i-Si$_{1-x}$Ge$_x$ spacer layer 121. The i-Si layer 120 to which a tensile strain is applied, the i-Si$_{1-y}$Ge$_y$ layer 119 (where y=0.2) of which the strain has been relaxed, and the i-Si cap layer 118 to which a tensile strain is applied, are stacked one upon the other on the i-Si$_{1-x}$Ge$_x$ spacer layer 121. On the i-Si cap layer 118, the SiO₂ layer 117 as the gate oxide film and the gate electrode 116 are formed in this order via the i-Si cap layer 142 interposed therebetween.

On the left-hand side of FIG. 8, shown is a valence band appearing when a negative gate bias voltage is applied to the multi-layered transistor shown in the center of FIG. 8 to make the transistor operate as PMOSFET. On the right-hand side of FIG. 8, shown is a conduction band appearing when a positive gate bias voltage is applied to the multilayered transistor to make the transistor operate as NMOSFET. That is to say, one of the transistors can be operated as PMOSFET and the other as NMOSFET by using the same multilayer structure.

To make the portion shown in the center of FIG. 8 operate as PMOSFET, holes are confined in the p-channel by utilizing the offset at the valence band in the first interface 137 between the i-Si$_{1-y}$Ge$_y$ layer 119 and the i-Si cap layer 118. And a negative gate bias voltage is applied to the gate electrode 116, thereby making the holes move. In this case, if the magnitude of the strain is adjusted by changing the Ge mole fraction in the i-Si$_{1-y}$Ge$_y$ layer 119, then the band offset at the first interface 137 is controllable.

To make the portion shown in the center of FIG. 8 operate as NMOSFET, electrons are confined in the n-channel by utilizing the offset at the conduction band in the third interface 139 between the i-Si layer 120 and the i-Si$_{1-x}$Ge$_x$ spacer layer 121. And a positive gate bias voltage is applied to the gate electrode 116, thereby making the electrons move. Unlike the PMOSFET, the n-channel is formed within the Si layer 120. In this case, if the magnitude of the strain is adjusted in the same way as the PMOSFET, then the band offset is also controllable.

FIGS. 9(*a*) and 9(*b*) are cross-sectional views illustrating part of a semiconductor device fabrication process according to the second embodiment. In the second embodiment, the same process steps as those of the second prior art example may be performed to form a portion under the channel.

First, in the process step shown in FIG. 9(*a*), the Si$_{1-x}$Ge$_x$ (where x=0.3) buffer layer 123 and i-Si$_{1-x}$Ge$_x$ (where x=0.3) spacer layer 121 are formed in this order on an Si substrate (not shown). The δ-doped layer 122 is formed in the i-Si$_{1-x}$Ge$_x$ spacer layer 121 by locally introducing dopant ions into the layer 121 during the epitaxial growth thereof. Then, the i-Si layer 120, which contains C and to which a tensile strain is applied, the i-Si$_{1-y}$Ge$_y$ layer 119 (where y=0.2) of which the strain has been relaxed, and the lower Si cap layer 118, which contains C and to which a tensile strain is applied, are stacked one upon the other on the i-Si$_{1-x}$Ge$_x$ spacer layer 121. As in the first embodiment, C may be introduced into the i-Si layer 120 and lower Si layer 118 by ion implantation, CVD, UHV-CVD or MBE. When the ion implantation method is adopted, C may be implanted into the i-Si layer 120 with low implant energy applied just after the i-Si layer 120 has been formed. Alternatively, C may be implanted after the i-Si$_{1-y}$Ge$_y$ layer 119 and the lower Si cap layer 118 have been formed on the i-Si layer 120 such that C is contained in all of the i-Si layer 120, i-Si$_{1-y}$Ge$_y$ layer 119 and lower Si cap layer 118. In such a case, the implantation process may be performed just once. If the CVD process is adopted, then a gas containing methyl silane (SiH₃CH₃) may be used.

Then, in the process step shown in FIG. 9(*b*), the i-Si cap layer 142 is oxidized, thereby forming the SiO₂ film 117 to be the gate oxide film. In this process step, the oxidation may be stopped at about 750° C. just before the Si/SiO₂ interface 135 reaches the lower Si cap layer 118 containing C while taking the diffusion rate of C and oxidation rate of Si into account.

Thereafter, a p⁺-type polysilicon film is deposited and then patterned, thereby forming the gate electrode 116. Although the illustration of subsequent process steps is omitted, carrier dopant ions (e.g., boron fluoride (BF₂⁺) ions in this embodiment) are implanted into the substrate from above the gate electrode as in the ordinary MOS transistor fabrication process. In this manner, the source/drain regions 153, 154 are defined to be self-aligned with the gate electrode 116 (see FIG. 6(a)). Furthermore, a metal film is deposited over the substrate and then patterned, thereby forming the source/drain contacts 151, 152.

According to the second embodiment, the i-Si layer 120 and the lower Si cap layer 118 are doped with C unlike the second prior art example. Thus, neither structural disorder nor lattice defects are brought about in the interfaces 137, 138 and 139 because the movement and diffusion of Ge atoms are suppressed. In addition, the reliability of the gate insulating film is not risked by the segregation of the Ge atoms 106 to the Si/SiO$_2$ interface 135.

Moreover, in the semiconductor device according to the second embodiment where the Si/SiGe heterojunctions are used, the same multilayer structure can be selectively used as NMOSFET or PMOSFET by changing the direction of the gate bias voltage. Accordingly, an HCMOS device with excellent conductivity can be obtained through relatively simple process steps if a single multilayer structure is separated and isolated via the STI to define separate source/drain regions and gate electrode.

The preferable range of the C concentration is as described in the first embodiment.

Embodiment 3

Figure 10:
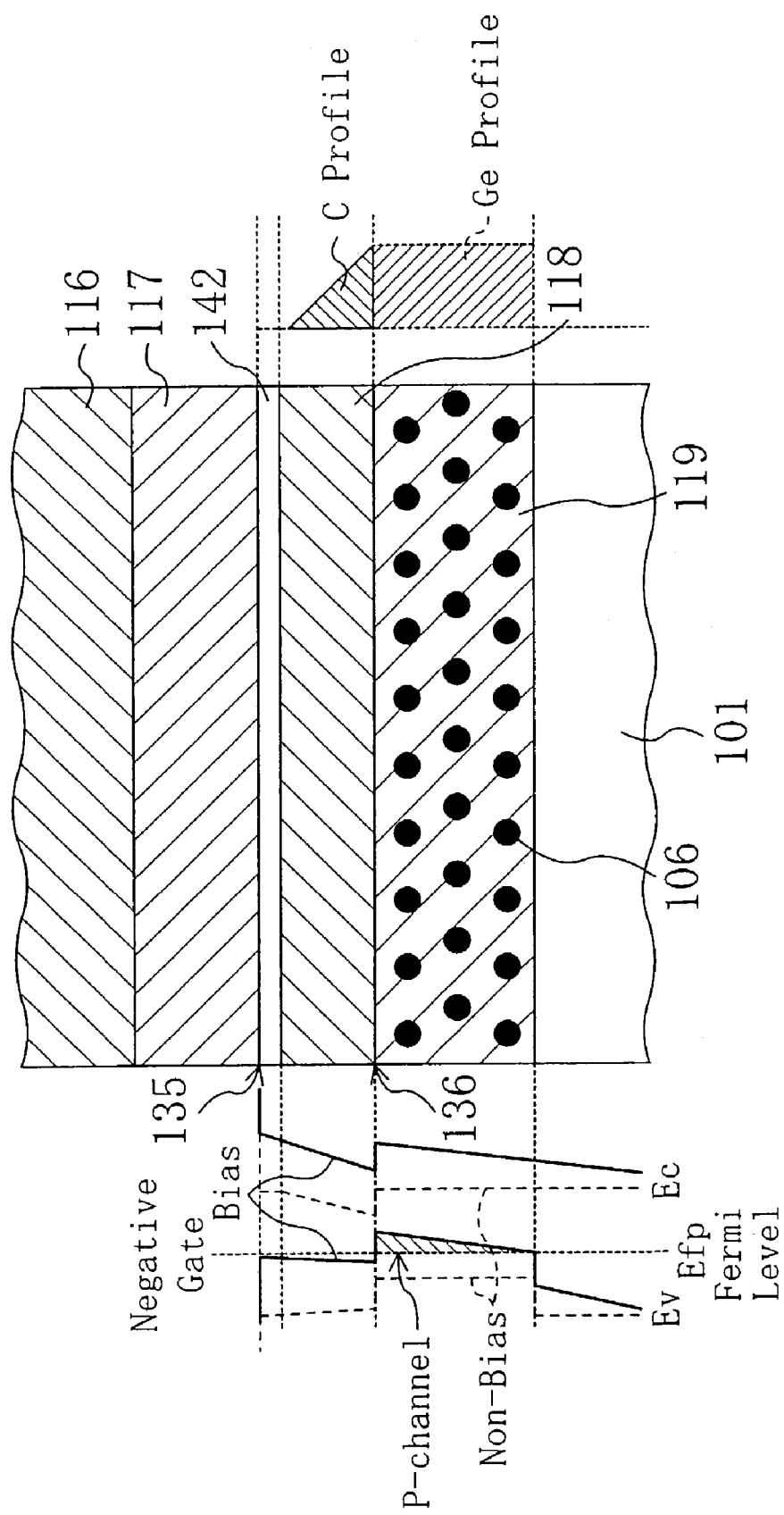
FIG. 10 is a cross-sectional view illustrating part of a semiconductor device according to a third embodiment of the present invention.

FIG. 10 is a cross-sectional view illustrating part of a semiconductor device (or HMOS transistor) according to a third embodiment of the present invention, in which C contained in the Si layer above the Si/SiGe interface has a concentration gradient. The cross section illustrated in FIG. 10 corresponds to the region R10a shown in FIG. 6(a).

As shown in FIG. 10, the HMOS transistor includes: Si substrate 101; p$^+$-type polysilicon gate electrode 116; SiO$_2$ layer 117; intrinsic (i-) Si cap layer 142; lower Si layer 118 containing C with a concentration gradient; and i-Si$_{1-y}$Ge$_y$ layer 119 (where 0<y<1, e.g., y=0.2). In FIG. 10, the SiO$_2$/Si interface and Si/Si$_{1-y}$Ge$_y$ interfaces are identified by the reference numerals 135 and 136, respectively.

The HMOS transistor according to the third embodiment has substantially the same structure as that of the HMOS transistor shown in FIGS. 6(a) and 6(b). In the HMOS transistor of the third embodiment, C contained in the lower Si cap layer 118 has a concentration gradient as shown on the right-hand side of FIG. 10. Specifically, the C concentration in the lower Si cap layer 118 is maximum around the Si/SiGe interface 136, decreases monotonically from the interface 136 toward the i-Si cap layer 142 and finally reaches substantially zero at the interface between the lower Si cap layer 118 and i-Si cap layer 142.

Such a concentration profile of C can be obtained by gradually decreasing the content of carbon-forming gas in the source gases when the lower Si cap layer 118 is formed by CVD, UHV-CVD or MBE process.

According to the third embodiment, the same effects as those of the first embodiment are also attainable. In addition, since the C concentration is almost zero at the interface between the lower Si cap layer 118 and the i-Si cap layer 142, it is possible to prevent the C atoms from reaching the SiO$_2$ layer 117. Accordingly, decline in reliability of the SiO$_2$ layer 117 and decrease in carrier mobility, which results from the formation of interface, levels, can be both prevented.

Embodiment 4

Figure 11:
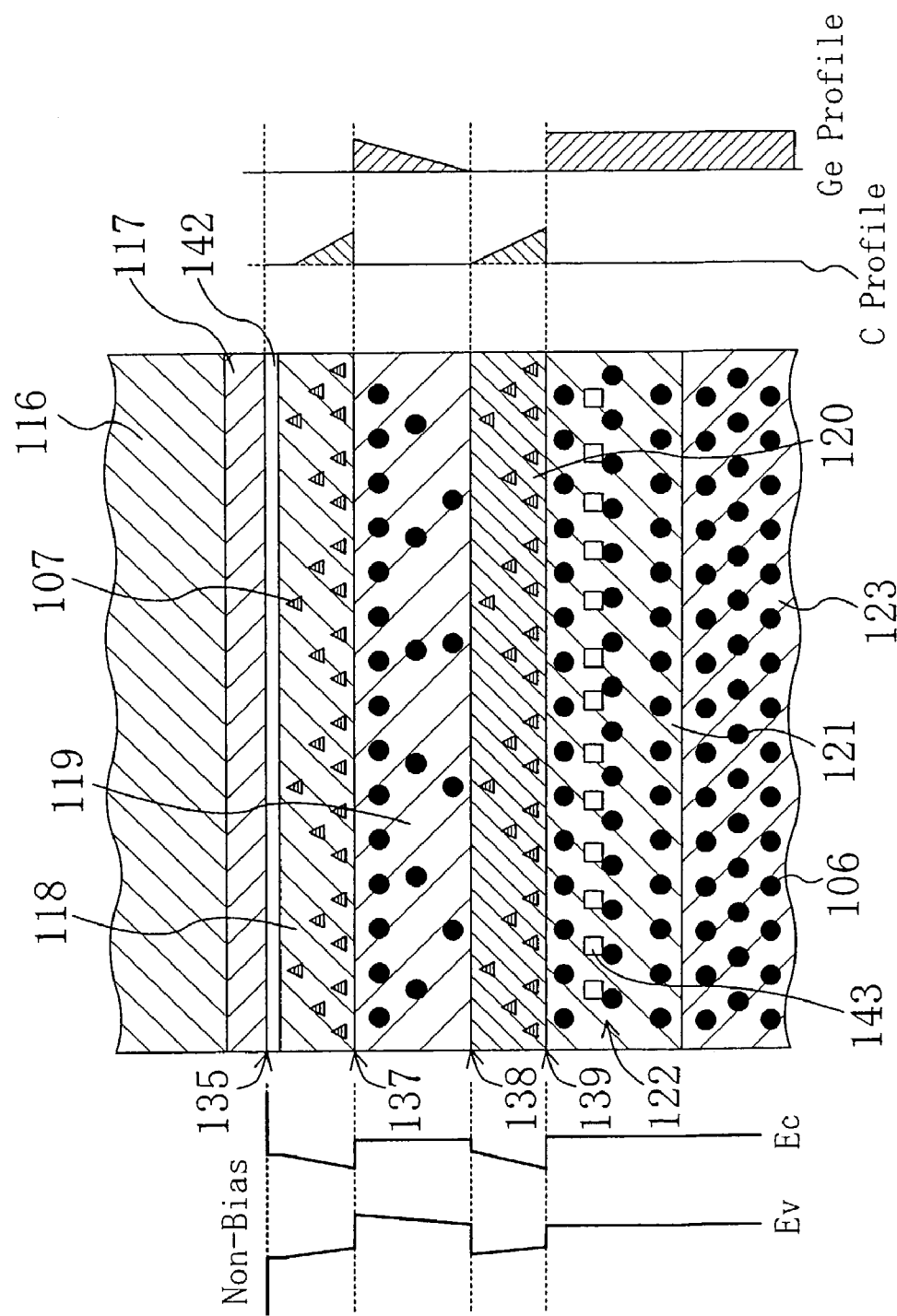
FIG. 11 is a cross-sectional view illustrating part of a semiconductor device according to a fourth embodiment of the present invention.

FIG. 11 is a cross-sectional view illustrating part of a semiconductor device (i.e., HCMOS device) according to a fourth embodiment of the present invention. In the device according to the fourth embodiment, both the Si layers 118 and 120 above the two Si/SiGe interfaces 137 and 139 have graded C concentration profiles. FIG. 11 corresponds to the region R20b according to the second embodiment shown in FIG. 8 but illustrates a larger region covering the gate electrode and buffer layer.

As shown in FIG. 11, the Si$_{1-x}$Ge$_x$ (where x=0.3) buffer layer 123 of which the strain has been relaxed, i-Si$_{1-x}$Ge$_x$ spacer layer 121, δ-doped layer 122, i-Si layer 120 containing C with a graded concentration profile, i-Si$_{1-y}$Ge$_y$ layer 119 (where 0<y<1) containing Ge with a graded concentration profile, lower Si cap layer 118 containing C with a graded concentration profile, i-Si cap layer 142, SiO$_2$ layer 117 functioning as a gate insulating film and polysilicon gate electrode 116 are stacked in this order. Also, the SiO$_2$/Si interface and first, second and third interfaces are identified by the reference numerals 135, 137, 138 and 139, respectively. Furthermore, in FIG. 11, Ge, C and dopant atoms are identified by the reference numerals 106, 107 and 143, respectively.

According to this embodiment, an HCMOS device is made up of n- and p-channel MOS transistors each including the Si$_{1-y}$Ge$_y$ layer 119 as in the second prior art example. Also, according to this embodiment, superior conductivity is attainable compared to a homojunction transistor formed on an Si substrate. In addition, since the n- and p-channel MOS transistors are formed using a common multilayer structure, the fabrication process thereof is simplified.

The HCMOS device according to the fourth embodiment has substantially the same structure as, but different in some respect from, the HCMOS device according to the second embodiment shown in FIG. 8. Hereinafter, these respects will be described with reference to FIGS. 12(a) and 12(b).

Firstly, the C concentration in the lower Si cap. layer 118 is maximum around the Si/SiGe interface 137, decreases monotonically from the Si/SiGe interface 137 toward the i-Si cap layer 142 and finally reaches substantially zero at the interface between the lower Si cap layer 118 and i-Si cap layer 142. As in the third embodiment, if the concentration of C has such a profile, then adverse effects of C on the SiO$_2$ layer 117 can be avoided substantially.

Figure 12A:
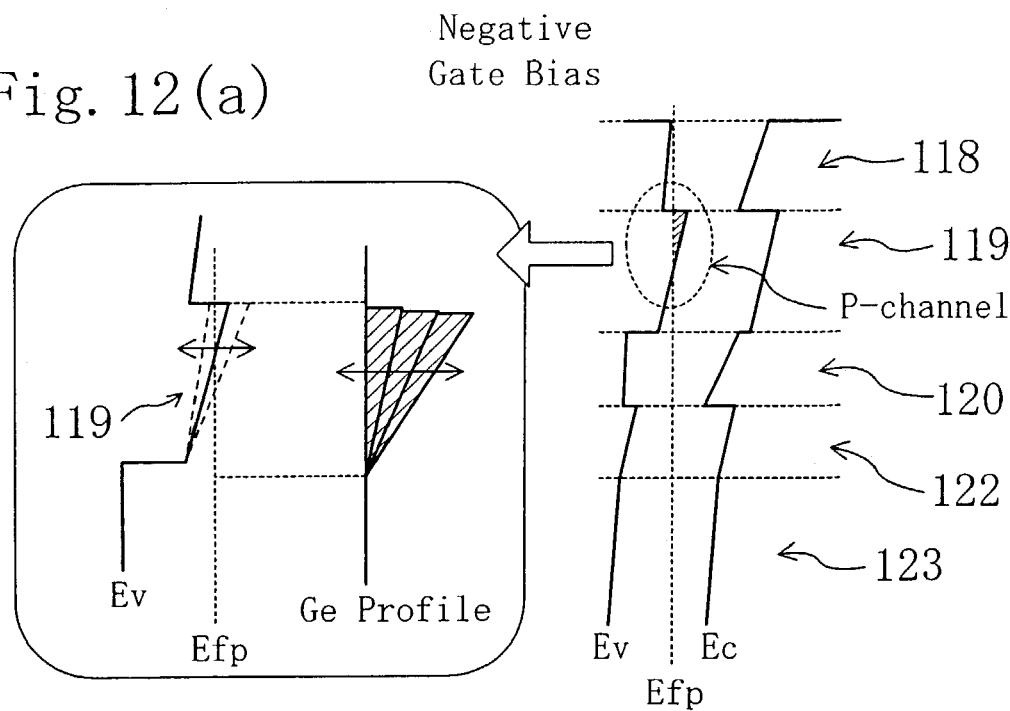
FIGS. 12(a) and 12(b) respectively illustrate how to regulate the threshold voltages of PMOSFET and NMOSFET according to the fourth embodiment.
Figure 12B:
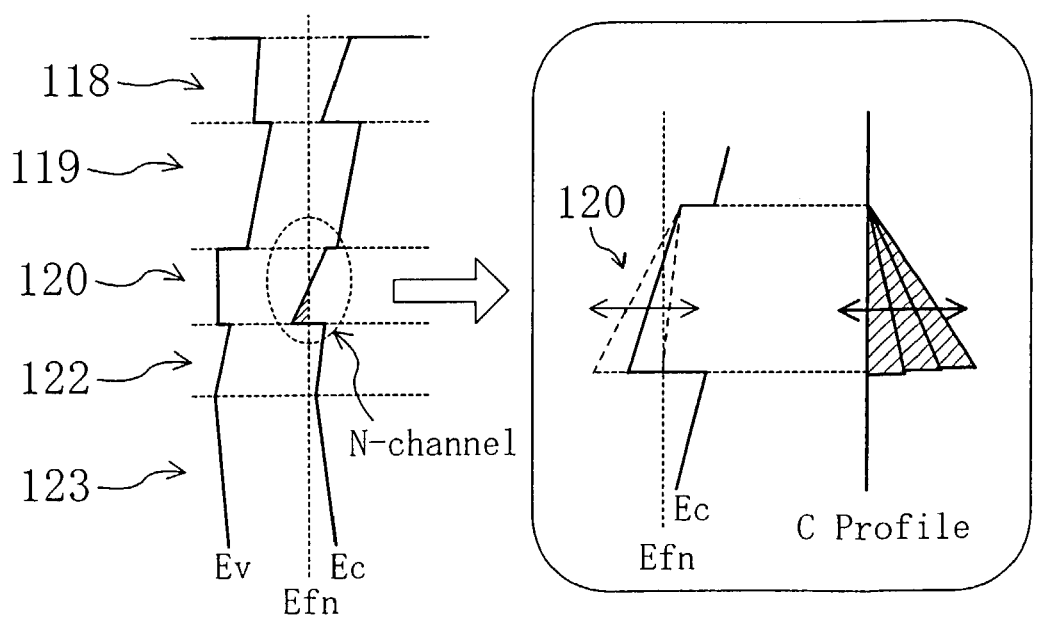

Secondly, the Ge content in the i-Si$_{1-y}$Ge$_y$ layer 119 increases from the second to first interface 138 to 137. As shown in FIG. 12(a), if the Ge content in the i-Si$_{1-y}$Ge$_y$ layer 119 is graded, then the energy level Ev at the edge of the valence band can be modified and the depth of the p-channel formed in the first interface 137 for confining holes therein can be adjusted, thus making the threshold voltage of the PMOSFET freely controllable. In such a case, the characteristic value of the PMOSFET can be optimized because the characteristics of the NMOSFET are not affected at all. In addition, since holes can be confined more efficiently, the number of carriers flowing into a parasitic channel formed around the Si/SiO$_2$ interface 135 can be reduced and the mobility thereof can be increased.

Thirdly, the concentration of C in the i-Si layer 120 has such a profile as gradually decreasing from the third toward the second interface 139 to 138. With such a C concentration profile, when a positive voltage is applied to the gate electrode 116, an n-channel is formed in the i-Si layer 120 at a location closer to the SiGe spacer layer 121 that has been delta-doped with the dopant atoms 143. Thus, carriers can be created more efficiently, the driving power of the NMOSFET can be increased and the threshold voltage of the NMOSFET can be regulated. These effects will be detailed with reference to FIG. 12(b).

In general, if an Si layer containing C is grown on a (001) plane of a silicon substrate, then tensile strain is caused because C is contained in the Si layer. Supposing the concentration of C is represented by t %, the strain has a magnitude of 0.35 t. According to the computations carried out by the present inventors, the energy level Ec at the edge of the conduction band of Si containing C shifts from that of Si not containing C toward the valence band by −4.9 t (eV). In response, the energy level Ev at the edge of the valence band shifts toward the conduction band by −1.5 t (eV). In the Si layer containing C at a variable mole fraction, if the concentration t is changed from 0.03% to 0%, for example, then the energy level Ev at the edge of the valence band shifts toward the conduction band by about 45 mev.

In the PMOSFET according to the fourth embodiment, the i-Si layer 120 containing C is formed on the $Si_{1-x}Ge_x$ layer with a relaxed strain and a tensile strain is applied to the i-Si layer 120. Accordingly, the band structure of the i-Si layer 120 receiving the tensile strain also changes similarly, although the change of band structure depends on the Ge content in the underlying $Si_{1-x}Ge_x$ layer (i.e., the i-$Si_{1-x}Ge_x$ spacer layer 121 in this case).

That is to say, by changing, or increasing and decreasing, the C concentration, the energy level Ec at the edge of the conduction band around the n-channel is controllable. In this manner, the threshold voltage of the NMOSFET can be controlled more freely without affecting the characteristics of the PMOSFET at all.

Such a concentration profile of C can be obtained by gradually decreasing the content of carbon-forming gas in the source gases when the lower Si cap layer 118 and i-Si layer 120 are formed by CVD, UHV-CVD or MBE process.

In the foregoing embodiment, both of the C concentration profiles in the lower Si cap layer 118 and the i-Si layer 120 are graded. Alternatively, only one of these C concentration profiles may be graded, while the other may be substantially uniform.

What is claimed is:

1. A method for fabricating a MOSFET semiconductor device, comprising the steps of:
    a) forming a first semiconductor layer, which is made of $Si_{1-y}Ge_y$ (0<y<1), on a substrate;
    b) forming a second semiconductor layer made of Si including carbon in contact with the first semiconductor layer; and
    c) annealing the substrate,
    wherein the carbon suppresses movement of at least one constituent of the first semiconductor layer into the second semiconductor layer,
    wherein the step b) further comprises the steps of:
    b-1) forming a second semiconductor layer, which is made of Si, on the first semiconductor layer;
    b-2) forming an intrinsic Si layer on the second semiconductor layer;
    b-3) doping the second semiconductor layer with carbon; and
    b-4) forming an oxide film substantially reaching the Si layer by oxidizing the intrinsic Si layer after the step b-3) has been performed.

2. A method for fabricating a MOSFET semiconductor device, comprising the steps of:
    a) forming a first semiconductor layer, which is made of $Si_{1-y}Ge_y$ (0<y<1), on a substrate;
    b) forming a second semiconductor layer made of Si including carbon on the first semiconductor layer; and
    c) annealing the substrate,
    wherein the step b) comprises the steps of:
    b-1) forming a second semiconductor layer, which is made of Si, on the first semiconductor layer;
    b-2) forming an intrinsic Si layer on the second semiconductor layer;
    b-3) doping the second semiconductor layer with carbon such that the concentration of carbon in the second semiconductor layer decreases upward; and
    b-4) forming an oxide film substantially reaching the second semiconductor layer by oxidizing the intrinsic Si layer after the step b-3) has been performed.

3. A method for fabricating a MOSFET semiconductor device, comprising the steps of:
    a) forming a first semiconductor layer, which is made of $Si_{1-y}Ge_y$ (0<y<1), on a substrate;
    b) forming a second semiconductor layer made of Si including carbon in contact with the first semiconductor layer; and
    c) annealing the substrate,
    wherein the carbon suppresses movement of at least one constituent of the first semiconductor layer into the second semiconductor layer,
    wherein in the step b), forming a second semiconductor layer such that the concentration of carbon in the second semiconductor layer decreases in a direction away from contact with the first semiconductor layer,
    wherein in the step b), a CVD, UHV-CVD or MBE process is performed,
    wherein the step b) further comprises the steps of:
    b-1) forming a second semiconductor layer, which is made of Si, on the first semiconductor layer;
    b-2) forming an intrinsic Si layer on the second semiconductor layer;
    b-3) doping the second semiconductor layer with carbon such that the concentration of carbon in the second semiconductor layer decreases upward; and
    b-4) forming an oxide film substantially reaching the second semiconductor layer by oxidizing he intrinsic Si layer after the step b-3) has been performed.

* * * * *

UNITED STATES PATENT AND TRADEMARK OFFICE
CERTIFICATE OF CORRECTION

PATENT NO. : 7,049,198 B2 Page 1 of 1
APPLICATION NO. : 10/377771
DATED : May 23, 2006
INVENTOR(S) : Koichiro Yuki et al.

It is certified that error appears in the above-identified patent and that said Letters Patent is hereby corrected as shown below:

What is claimed is:

Claim 3, column 18, line 53, "he intrinsic" should read -- the intrinsic --.

Signed and Sealed this

Thirtieth Day of January, 2007

JON W. DUDAS
*Director of the United States Patent and Trademark Office*